（12）United States Patent
Kidoh et al.

(10) Patent No.: US 8,278,695 B2
(45) Date of Patent: Oct. 2, 2012

(54) NONVOLATILE SEMICONDUCTOR MEMORY DEVICE AND MANUFACTURING METHOD THEREOF

(75) Inventors: Masaru Kidoh, Kawasaki (JP); Ryota Katsumata, Yokohama (JP); Hiroyasu Tanaka, Tokyo (JP); Hideaki Aochi, Kawasaki (JP); Masaru Kito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1122 days.

(21) Appl. No.: 11/898,746

(22) Filed: Sep. 14, 2007

(65) Prior Publication Data

US 2008/0067583 A1 Mar. 20, 2008

(30) Foreign Application Priority Data

Sep. 15, 2006 (JP) ................................. 2006-251315

(51) Int. Cl.
*H01L 29/76* (2006.01)
*G11C 16/04* (2006.01)
(52) U.S. Cl. ........ 257/314; 257/316; 257/315; 257/326; 257/E21.662; 257/E21.679
(58) Field of Classification Search ........... 257/E21.662, 257/E27.084, E21.661, E27.085, E21.646, 257/331, 777, 314–316, E21.209, E21.613, 257/E21.645, 324–326; 365/185.17, 185.01
See application file for complete search history.

(56) References Cited

U.S. PATENT DOCUMENTS

| 4,530,149 | A | 7/1985 | Jastrzebski et al. |
| 4,554,570 | A | 11/1985 | Jastrzebski et al. |
| 4,566,025 | A | 1/1986 | Jastrzebski et al. |

(Continued)

FOREIGN PATENT DOCUMENTS

| JP | 59-17285 | 1/1984 |
| JP | 03-114233 | 5/1991 |

(Continued)

OTHER PUBLICATIONS

S.M. Sze, Semiconductor Devicwes. Physics and Technology, 2nd Edition, 2002, pp. 509-510.*

(Continued)

*Primary Examiner* — Colleen A Matthews
*Assistant Examiner* — Galina Yushina
(74) *Attorney, Agent, or Firm* — Finnegan, Henderson, Farabow, Garrett & Dunner, L.L.P.

(57) ABSTRACT

A nonvolatile semiconductor memory device includes a substrate, and a plurality of memory strings, the memory string including a first selection transistor including a first pillar shaped semiconductor formed perpendicular to the substrate, a first gate insulating film formed around the first pillar shaped semiconductor, and a first gate electrode formed around the first gate insulating film, and a plurality of memory cells including a second pillar shaped semiconductor formed on the first pillar shaped semiconductor, the diameter of the first pillar shaped semiconductor being larger than the diameter of the second pillar shaped semiconductor at the part where the second pillar shaped semiconductor is connected to the first pillar shaped semiconductor, a first insulating film formed around the second pillar shaped semiconductor, a charge storage layer formed around the first insulating film, a second insulating film formed around the charge storage layer, and first to nth electrodes formed around the second insulating film (n is a natural number not less than 2), the first to nth electrodes being plate shaped, the first to nth electrodes being first to nth conductor layers spread in two dimensions, and a second selection transistor including a third pillar shaped semiconductor formed on the second pillar shaped semiconductor, a second gate insulating film formed around the third pillar shaped semiconductor and a second gate electrode formed around the second gate insulating film.

12 Claims, 33 Drawing Sheets

U.S. PATENT DOCUMENTS

| | | | |
|---|---|---|---|
| 5,136,350 A | 8/1992 | Itoh | |
| 5,350,705 A * | 9/1994 | Brassington et al. | 257/295 |
| 5,599,724 A | 2/1997 | Yoshida | |
| 5,707,885 A * | 1/1998 | Lim | 438/155 |
| 5,936,274 A * | 8/1999 | Forbes et al. | 257/315 |
| 5,943,262 A * | 8/1999 | Choi | 365/185.17 |
| 6,329,281 B1 | 12/2001 | Lytle et al. | |
| 6,855,983 B1 | 2/2005 | Kushida | |
| 6,870,215 B2 * | 3/2005 | Endoh et al. | 257/316 |
| 2002/0154556 A1 | 10/2002 | Endoh et al. | |
| 2003/0057564 A1 * | 3/2003 | Leedy | 257/777 |
| 2004/0253813 A1 | 12/2004 | Son et al. | |
| 2005/0063237 A1 * | 3/2005 | Masuoka et al. | 365/222 |
| 2006/0028861 A1 * | 2/2006 | Han et al. | 365/154 |
| 2006/0050559 A1 | 3/2006 | Sakui et al. | |
| 2007/0252201 A1 * | 11/2007 | Kito et al. | 257/331 |
| 2009/0090965 A1 | 4/2009 | Kito et al. | |

FOREIGN PATENT DOCUMENTS

| | | | |
|---|---|---|---|
| JP | 06-338602 | * | 12/1994 |
| JP | 07-235649 | | 9/1995 |
| JP | 08-298286 | | 11/1996 |
| JP | 10-093083 | | 4/1998 |
| JP | 2000-150872 | | 5/2000 |
| JP | 2001-244336 | | 9/2001 |
| JP | 2003-078044 | | 3/2003 |
| JP | 2003-332421 | | 11/2003 |
| JP | 2004-282082 | | 10/2004 |

OTHER PUBLICATIONS

White et al. On the Go with SONOS. Circuits & Devices, Jul. 2000, pp. 22-31.*

Endoh et al.; "Novel Ultrahigh-Density Flash Memory With a Stacked-Surrounding Gate Transistor (S-SGT) Structured Cell"; IEEE Transaction on Electron Devices, vol. 50, No. 4, pp. 945-951, (2003).

Notice of Reasons for Rejection issued by the Japanese Patent Office on Feb. 22, 2011 for Japanese Patent Application No. 2006-251315 and English-language translation thereof.

* cited by examiner

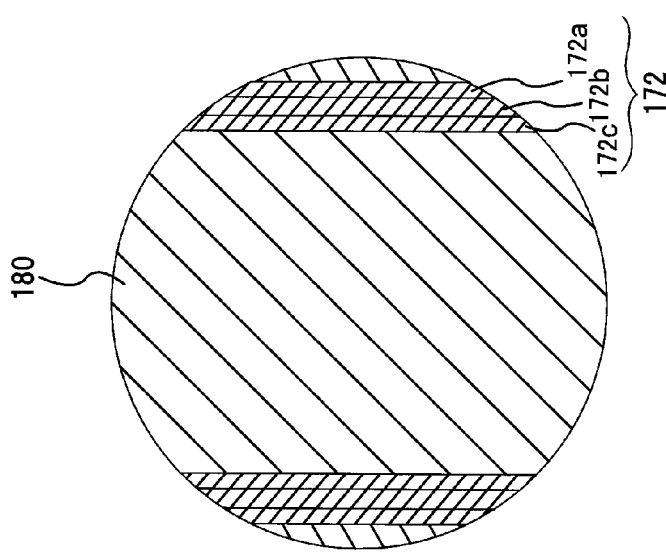

FIG. 20
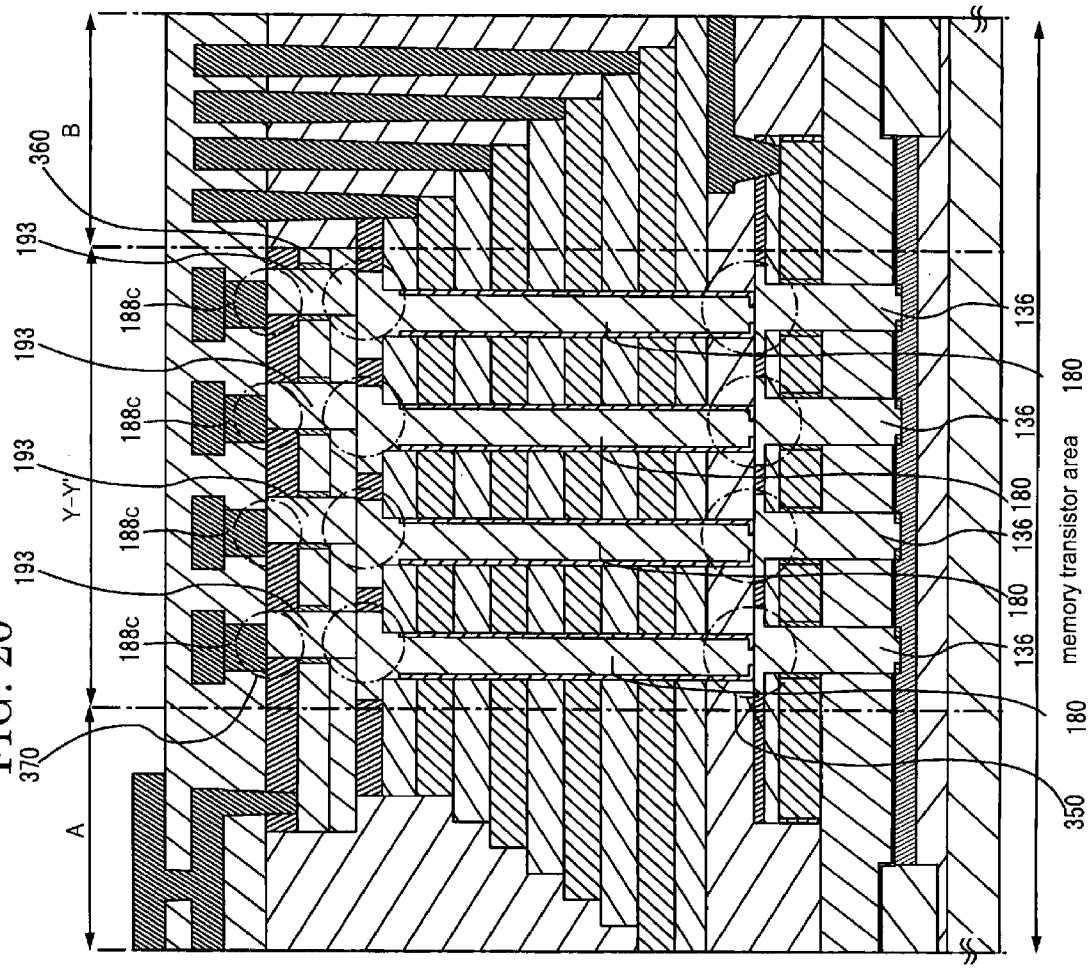
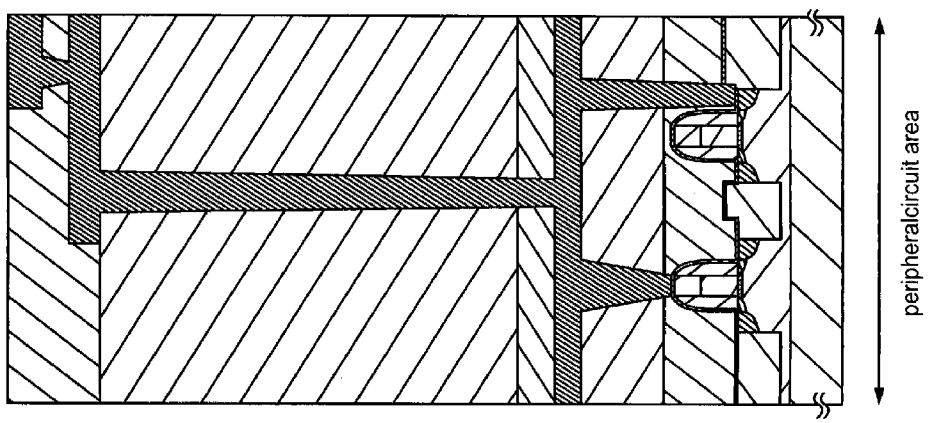

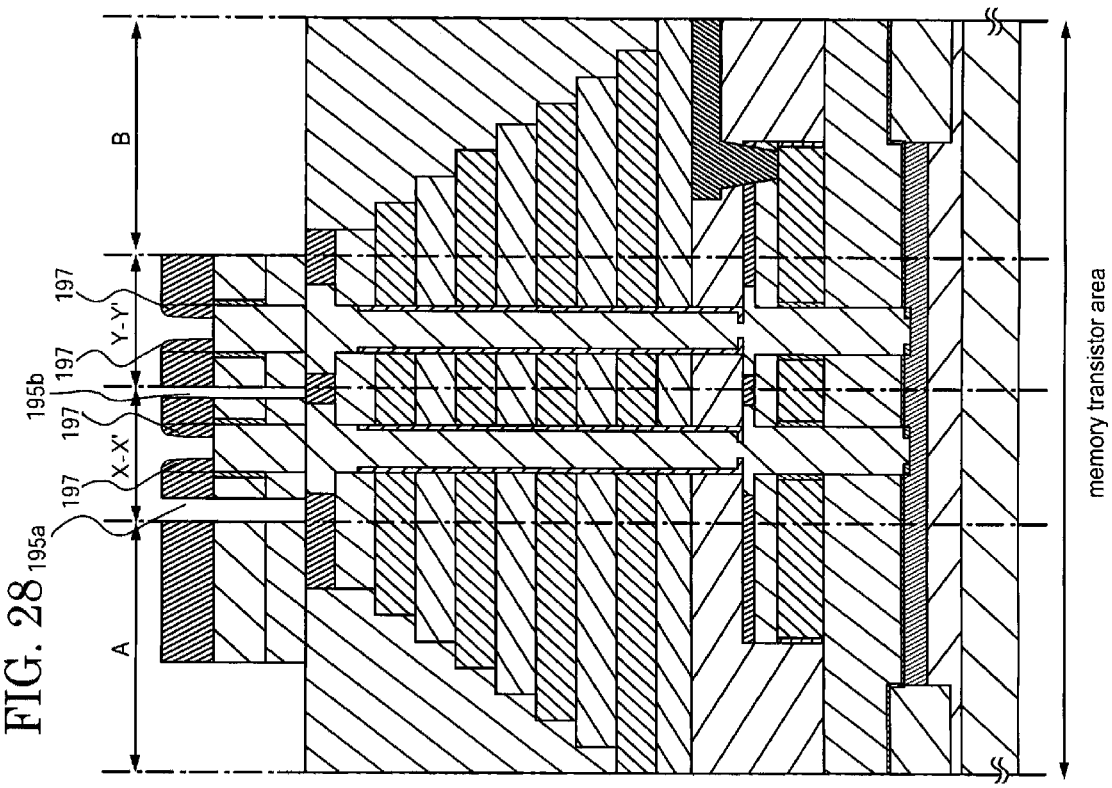
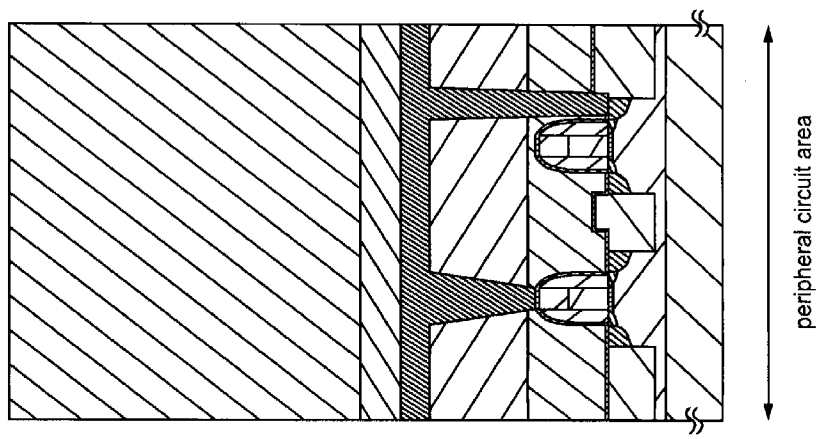
FIG. 28

NONVOLATILE SEMICONDUCTOR MEMORY DEVICE AND MANUFACTURING METHOD THEREOF

CROSS REFERENCE TO RELATED APPLICATION

This application is based upon and claims the benefit of priority from the prior Japanese Patent Application No. 2006-251315, filed on Sep. 15, 2006, the entire contents of which are incorporated herein by reference.

BACKGROUND OF THE INVENTION

1. Field of the Invention

The present invention is related to an electrically programmable semiconductor memory device, and particularly among such semiconductor memory devices, is related to a nonvolatile semiconductor memory device.

2. Description of the Related Art

Demand for a nonvolatile semiconductor memory device that is small and has a large capacity has been increasing rapidly, and a NAND type flash memory, in which higher integration and larger capacity can be expected, has attracted attention. Further micro processing of wiring patterns, for example, is required in order to miniaturize a NAND type flash memory. For realizing further micro processing of wiring patterns and so on, a high level of processing technology is required. Therefore, a reduction of the design rules has become difficult. Thus, in recent years, a large number of inventions on semiconductor memory devices, in which a three-dimensional memory cell is placed, has been suggested to raise the degree of integration of the memory (Japanese Patent Laid-Open No. 2003-078044, U.S. Pat. No. 5,599,724, U.S. Pat. No. 5,707,885, and "Masuoka et al. "Novel Ultra-high-Density Flash Memory With a Stacked-Surrounding Gate Transistor (S-SGT) Structured Cell", IEEE TRANSACTION SON ELECTRON DEVICES, VOL. 50, NO. 4, pp 945-951, Apr. 2003").

Many of the conventional semiconductor memory devices, in which a three dimensional memory cell is placed, need to perform a Photo Etching Process (hereinafter called "PEP", which represents a so-called process to perform a patterning using a lithography process with a photo resist and a manufacturing process such as etching,). Here, a Photo Etching Process performed with a smallest line width of the design rule is set as "a critical PEP", and a Photo Etching Process performed with a line width larger than the smallest line width of the design rule is set as "a rough PEP". In the conventional semiconductor memory device, in which a three-dimensional memory cell is disposed, it is required that the critical PEP number per one layer of a memory cell part should be equal to or more than 3. Additionally, in a conventional semiconductor memory device, there are many of those, in which memory cells are simply stacked, and thus a cost increase caused by three-dimensional manufacturing is inevitable.

Additionally, in a nonvolatile semiconductor memory device, in which memory cells are stacked in three dimensions, variations of processing size and misalignments may occur. In such a case, especially when the misalignment of contact in a channel region, a contact area is reduced, and resistance is increased. These adversely affect reliability of the device. Additionally, when misalignment of a metal wiring layer occurs, the metal wire and a channel of a transistor may short out. This also adversely affects reliability of the device.

BRIEF SUMMARY OF THE INVENTION

According to one embodiment of the present invention, a nonvolatile semiconductor memory device comprising a substrate, and a plurality of memory strings, the memory string comprising a first selection transistor comprising a first pillar shaped semiconductor formed perpendicular to the substrate, a first gate insulating film formed around the first pillar shaped semiconductor and a first gate electrode formed around the first gate insulating film, and a plurality of memory cells comprising a second pillar shaped semiconductor formed on the first pillar shaped semiconductor, the diameter of the first pillar shaped semiconductor being larger than the diameter of the second pillar shaped semiconductor at the part where the second pillar shaped semiconductor is connected to the first pillar shaped semiconductor, a first insulating film formed around the second pillar shaped semiconductor, a charge storage layer formed around the first insulating film, a second insulating film formed around the charge storage layer and first to nth electrodes formed around the second insulating film (n is a natural number not less than 2), the first to nth electrodes being plate shaped, the first to nth electrodes being first to nth conductor layers spread in two dimensions, and a second selection transistor comprising a third pillar shaped semiconductor formed on the second pillar shaped semiconductor, a second gate insulating film formed around the third pillar shaped semiconductor and a second gate electrode formed around the second gate insulating film.

In addition, according to one embodiment of the present invention, a nonvolatile semiconductor memory device comprising a substrate; and a plurality of memory strings, the memory string comprising a first selection transistor comprising a first pillar shaped semiconductor formed perpendicular to the substrate a first gate insulating film formed around the first pillar shaped semiconductor and a first gate electrode formed around the first gate insulating film, and a plurality of memory cells comprising a second pillar shaped semiconductor formed on the first pillar shaped semiconductor, a first insulating film formed around the second pillar shaped semiconductor, a charge storage layer formed around the first insulating film, a second insulating film formed around the charge storage layer and first to nth electrodes formed around the second insulating film (n is a natural number not less than 2), the first to nth electrodes being plate shaped, the first to nth electrodes being first to nth conductor layers spread in two dimensions, and a second selection transistor comprising a third pillar shaped semiconductor formed on the second pillar shaped semiconductor, the diameter of the second pillar shaped semiconductor being larger than the diameter of the third pillar shaped semiconductor at the part where the third pillar shaped semiconductor is connected to the second pillar shaped semiconductor, a second gate insulating film formed around the third pillar shaped semiconductor and a second gate electrode formed around said second gate insulating film.

In addition, according to one embodiment of the present invention a manufacturing method of a nonvolatile semiconductor memory device comprising forming a diffusion area having conductive impurities on a substrate, forming a first conductor film on the substrate, forming a first insulating film on the first conductor film, forming a first hole in the first conductor film and the first insulating film, etching a part of the wall part of the first hole of the first insulating film, forming a first pillar shaped semiconductor in the first hole, forming one or more second conductor films and one or more second insulating films in alternation on the first insulating film and the first pillar shaped semiconductor, forming a second hole in the one or more second conductor films and the one or more second insulating films, forming a third insulating film on the inner surface of the second hole, and forming a second pillar shaped semiconductor in the second hole.

BRIEF DESCRIPTION OF THE DRAWINGS

FIG. 13B shows a magnified view of the circled portion of FIG. 13A.

FIG. 20 is a diagram that shows the misalignment of the nonvolatile semiconductor memory device according to one embodiment of the present invention.

FIG. 28 is a diagram that shows a manufacturing process of the nonvolatile semiconductor memory device 1 according to another embodiment of the present invention.

DETAILED DESCRIPTION OF THE INVENTION

Figure 1:
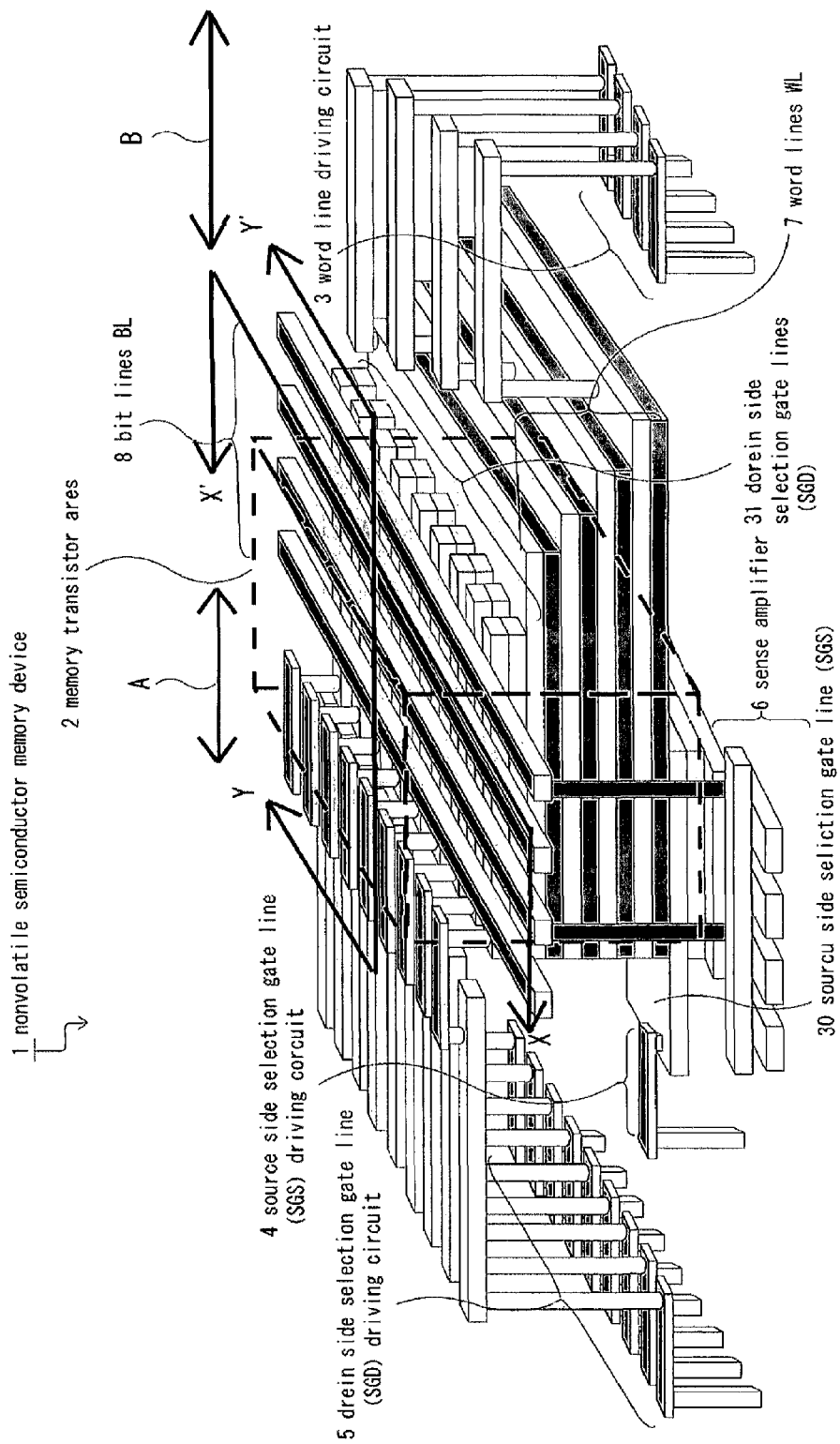
FIG. 1 is an outline diagram of the nonvolatile semiconductor memory device 1 according to one embodiment of the present invention.

The following description explains embodiments of the nonvolatile semiconductor memory device and the manufacturing methods of the present invention; however, the present invention is not limited to the following embodiments. Also, in each of the embodiments, the same reference numerals refer to the same elements, and thus repetitive explanation is omitted.

Embodiment 1

FIG. 1 is a schematic diagram showing a nonvolatile semiconductor memory device 1 according to the first embodiment of the present invention. The nonvolatile semiconductor memory device 1 according to the first embodiment of the present invention has a memory transistor area 2, a word line driving circuit 3, a source side selection gate line (SGS) driving circuit 4, a drain side selection gate lines (SGD) driving circuit 5, a sense amplifier 6, word lines 7, bit lines 8, a source side selection gate line 30, drain side selection gate lines 31 and so on. As shown in FIG. 1, in the nonvolatile semiconductor memory device 1 according to the first embodiment of the present invention, memory transistors that configure the memory transistor area 2 are formed collectively by laminating a plurality of semiconductor layers. In addition, the word line of each of the layers, are spread in two dimensions in a certain area. The word lines of each layer respectively have a plane structure comprising the same layer and have a plate-shaped plane structure. By such a structure, the processing process which includes PEP etc. is shortened considerably.

Figure 2:
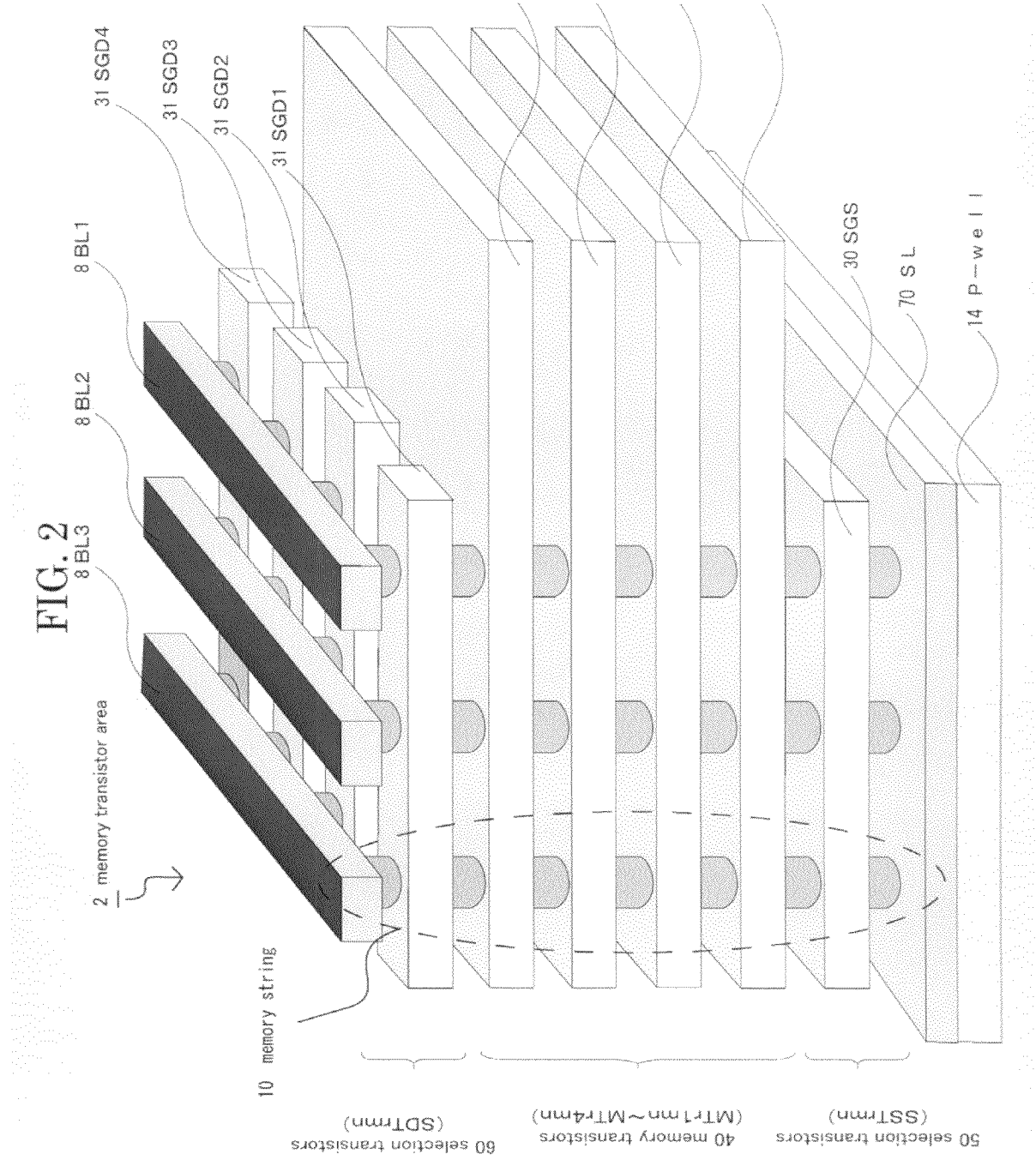
FIG. 2 is a part of an outline diagram of the memory transistor area 2 of the nonvolatile semiconductor memory device 1 according to one embodiment of the present invention.

FIG. 2 is a schematic diagram of a part of the memory transistor area 2 of the nonvolatile semiconductor memory device 1 according to the present embodiment. In this embodiment, the memory transistor area 2 has m×n of memory strings 10 (m and n are natural numbers). Each of the memory strings includes memory transistors (MTr1$mn$ to MTr4$mn$) 40 and selection transistors SSTrmn 50 and SDTrmn 60. In FIG. 2, an example of m=3 and n=4 is shown.

Word Lines (WL 1 to WL 4) 7 that are connected to the gates of memory transistors (MTr1$mn$ to MTr4$mn$) 40 of each of the memory strings 10, are each formed by the same conductive layer and each are common. That is, all of the gates of the memory transistor MTr1$mn$ of each of the memory strings 10 are connected to the word line 1, all of the gates of the memory transistor MTr2$mn$ of each of the memory strings 10 are connected to word line 2, all of the gates of memory transistor MTr3$mn$ of each of the memory strings 10 are connected to word line WL3, and all of the gates of the memory transistor MTr4$mn$ of each of the memory strings 10 are connected to word line 4. In the nonvolatile semiconductor memory device 1 according to the first embodiment of the present invention, as shown in FIGS. 1 and 2, the word lines (WL1 to WL4) are respectively spread in two dimensions and have a plate-shaped plane structure. Also, the word lines (WL1 to WL4) respectively have a plane structure, which is almost perpendicular to the memory strings 10. In addition, the source side selection gate line SGS 30, which drives the source side selection transistors SSTrmn 50, can be set as a common potential for each layer all the time as a matter of operation. Therefore, in this embodiment, the plate shaped structure is applied to the source side selection gate line SGS 30. However, the structure of the source side selection gate line SGS 30 is not limited to this. The source side selection gate lines 30 may have a wiring structure, in which the source side selection gate lines 30 are electrically isolated and insulated from each other. Also, the drain side selection gate lines SGD 31 may have a plate shaped structure and may have a wiring structure, in which the drain side selection gate lines SGD 31 are electrically isolated and insulated from each other.

Each of the memory strings 10 has a pillar shaped semiconductor on an n+ area that is formed in a P-well area 14 of the semiconductor substrate. Each of the memory strings 10 is arranged within a plane being perpendicular to the pillar shaped semiconductor in a matrix shape. In addition, the pillar shaped semiconductor may be a cylindrical shape or a prismatic shape. Also, a pillar shaped semiconductor includes a pillar shaped semiconductor having a stepwise shape.

Figure 3:
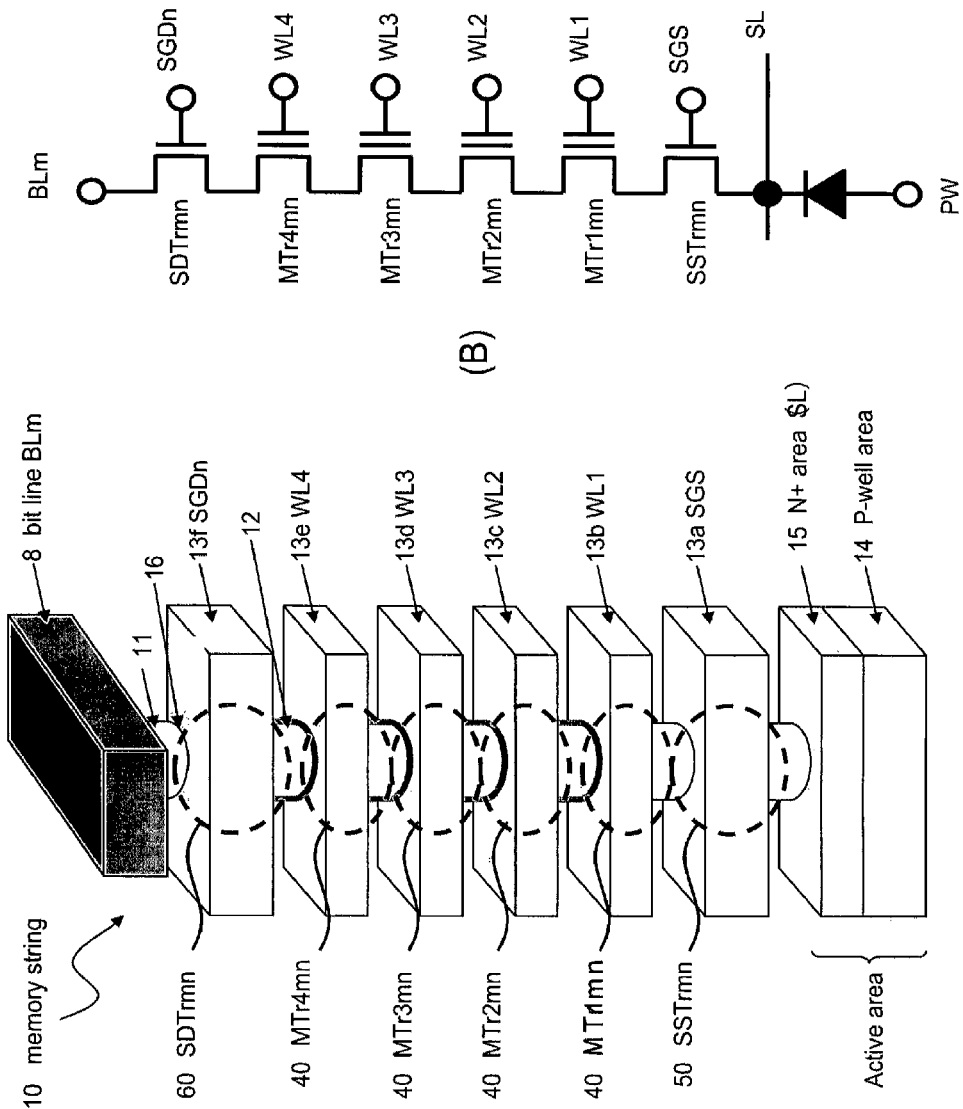
FIG. 3A is a diagram that shows an outline structure of one of the memory strings 10 of the nonvolatile semiconductor memory device 1 according to one embodiment of the present invention.
FIG. 3B is an equivalent circuit of the memory string shown in FIG. 3A.

A schematic diagram of one memory string 10 (here shown by mn-th memory string) of the nonvolatile semiconductor memory device 1 according to the first embodiment of the present invention is shown in FIG. 3A, and its equivalent circuit is shown in FIG. 3B. In this embodiment, the memory string 10 has 4 memory transistors MTr1$mn$ 40 to MTr4$nm$ 40, and two selection transistors SSTrmn 50 and SDTrmn 60. The 4 memory transistors MTr1$mn$ 40 to MTr4$mn$ 40 and two selection transistors SSTrmn 50 and SDTrmn 60 are connected in series respectively. In one memory string 10 of the nonvolatile semiconductor memory device 1 of this embodiment, a pillar shaped semiconductor 11 is formed on the N+ area 15 that is formed on the P-type area (P-Well area) on the semiconductor substrate. An insulating film 12 is formed around the pillar shaped semiconductor 11 and a plurality of plate shaped electrodes 13$a$ to 13$f$ are formed around the insulating film 12. The electrodes 13$a$ to 13$f$, the insulating film 12, and the pillar shaped semiconductor 11 form the memory transistors MTr1$mn$ 40 to MTr4$mn$ 40, the selection transistor SSTrmn 50 and the selection transistor SDTrmn 60. The electrodes 13$b$ to 13$e$ respectively become word lines WL1 (7) to WL4 (7), an electrode 13$f$ becomes a selection gate line SGDn, and 13$a$ becomes a selection gate line SGS. Also, a bit line BLm 8 is connected to an edge of source/drain of the selection transistor SDTrmn 60, a source line SL 7 (in this embodiment, it is the N+ area 15) is connected to an edge of the source/drain of the selection transistor SSTrmn 50. In this embodiment, the memory string 10 has 4 memory transistors MTr1$mn$ 40 to MTr4$mn$ 40 which are connected in series, however, the number of memory transistors in a memory string is not limited to this, but may be changed suitably if needed.

The following description explains the operation of the nonvolatile semiconductor memory device, which has the above-mentioned structure, according to the first embodiment of the present invention.

Reading Operation

Figure 4:
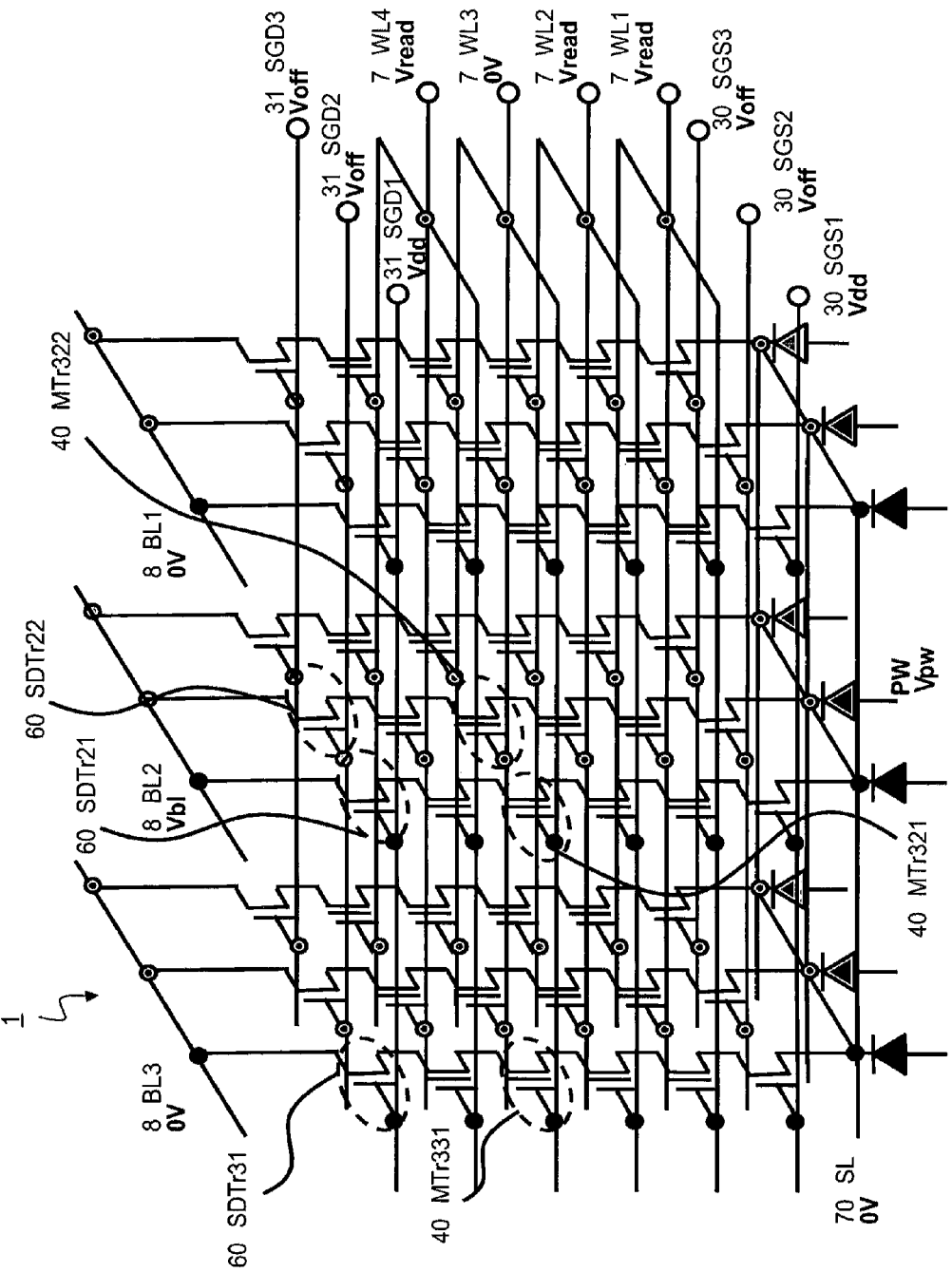
FIG. 4 is a diagram that shows a bias state in the case that reading operation of the data of the memory transistor MTr 3 shown by a dotted line is performed, in the nonvolatile semiconductor memory device 1 according to one embodiment of the present invention.

FIG. 4 shows the bias state of the memory transistor MTr 321 (40), which is shown by a dotted line, of the nonvolatile semiconductor memory device 1 according to the first embodiment of the present invention when a reading operation of data is performed. Here, an explanation will be given with the assumption that a memory transistor MTr is what is called a MONOS type vertical transistor, and that the threshold Vth of the memory transistor MTr which is in a situation where electrons are not accumulated in the charge storage layer (hereinafter called "neutral threshold") is near 0V.

At the time of data reading from the memory transistor MTr321 (40), Vbl (for example 0.7V) is applied to the bit line BL2 (8), 0V is applied to other bit lines, 0V is applied to the source line SL70, Vdd (for example 3.0V) is applied to the selection gate lines SGD1 (31) and SGS1 (30), Voff (for example 0V) is applied to other selection gate lines SGD (31) and SGS (30), and Vpw (for example 0V, however, Vpw may be any potential as long as the P-well area and the memory string 10 are not forward bias) is applied to the P-Well area. Then, the word line WL3 (7), which is connected to the bit desired to be read out (MTr321), is set as 0V, and other word lines WL (7) are set as Vread (for example, 4V). Because whether current flows through the bit line BL2 (8) is determined depending upon whether the threshold Vth of the bit desired to be read out (MTr321) is more or less than 0V, it becomes possible to read out data information of the bit (MTr321) by sensing current of the bit line BL2 (8).

In the nonvolatile semiconductor memory device 1 according to the first embodiment of the present invention, the data of the threshold of an arbitrary bit may be read by driving the word lines WL1 (7) to WL4 (7) with a common potential and driving the selection gate lines SGS1 (30) to SGS3 (30) with a common potential.

Programming Operation

Figure 5:
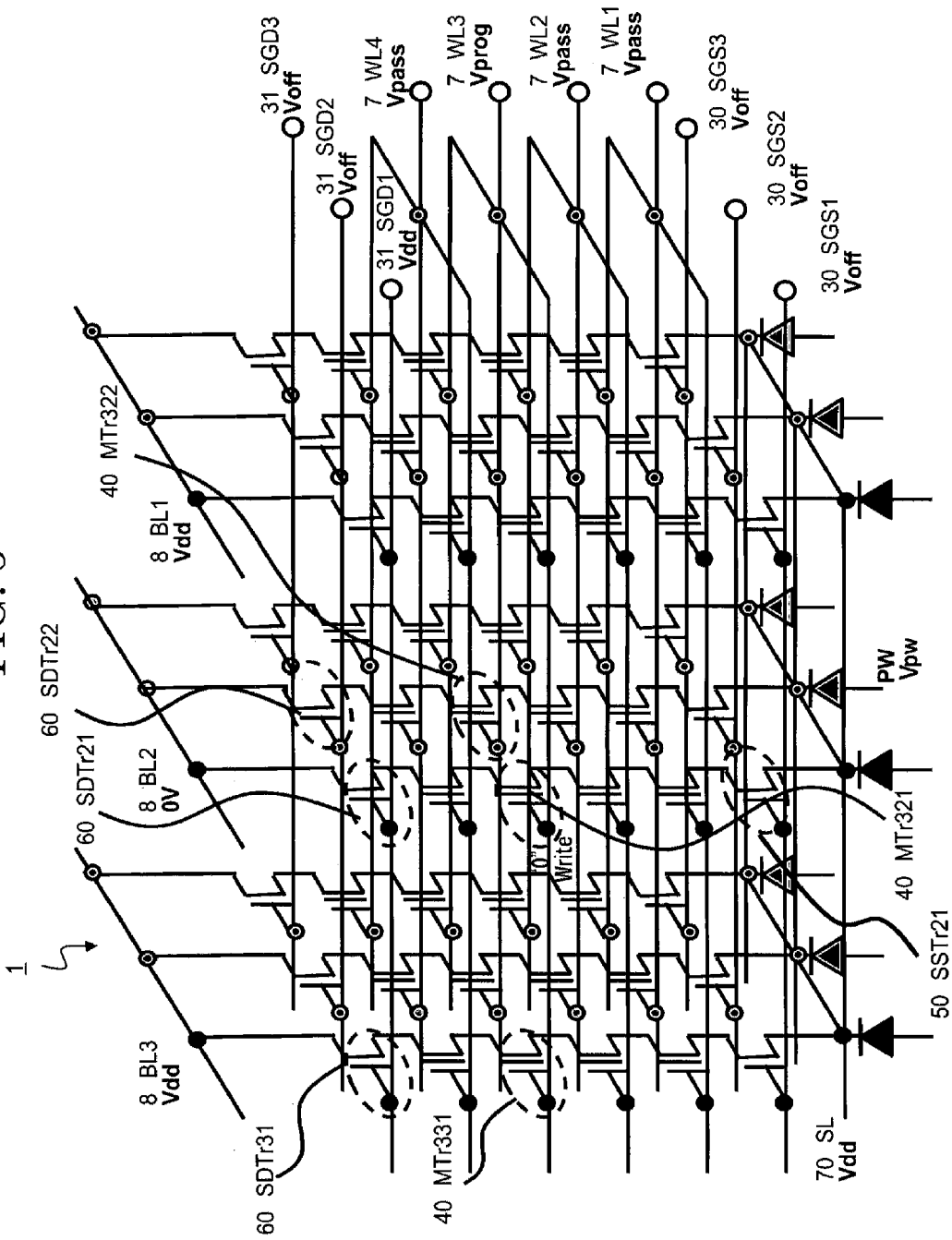
FIG. 5 is a diagram that shows a bias state in the case that programming operation of the data of the memory transistor MTr 3 shown by a dotted line is performed, in the nonvolatile semiconductor memory device 1 according to one embodiment of the present invention.

FIG. 5 shows the bias state of the memory transistor MTr321 (40), which is shown by a dotted line, of the nonvolatile semiconductor memory device 1 according to the first embodiment of the present invention when a programming operation of data is performed.

At the time of programming data "0" into the memory transistor MTr321, 0V is applied to the bit line BL2 (8), Vdd is applied to other bit lines BL (8), Vdd is applied to the source line SL70, Vdd is applied to the selection gate line SGD1 (31), Voff is applied to other selection gate lines SGD (31), Voff is applied to the selection gate lines SGS1 (30) to SGS3 (30), and Vpw (for example, 0V) is applied to the P-Well area. And the word line WL3 is set as Vprog (for example, 18V) and other word lines WL (7) are set as Vpass (for example, 10V), respectively. By doing so, electrons are injected into the charge storage layer, and then the threshold of the memory transistor MTr321 (40) is shifted toward a positive direction.

At the time of programming data "1" into the memory transistor MTr321 (40), i.e., electrons are not injected into the charge storage layer, Vdd is applied to the bit line BL2 (8). Therefore, the selection transistor SDTr21 (60) becomes an off-state, and electrons are not injected into the charge storage layer of the memory transistor MTr321 (40).

Page programming becomes possible by setting the potential of each of the bit lines (8) at 0V or Vdd appropriately.

Erasing Operation

Figure 6:
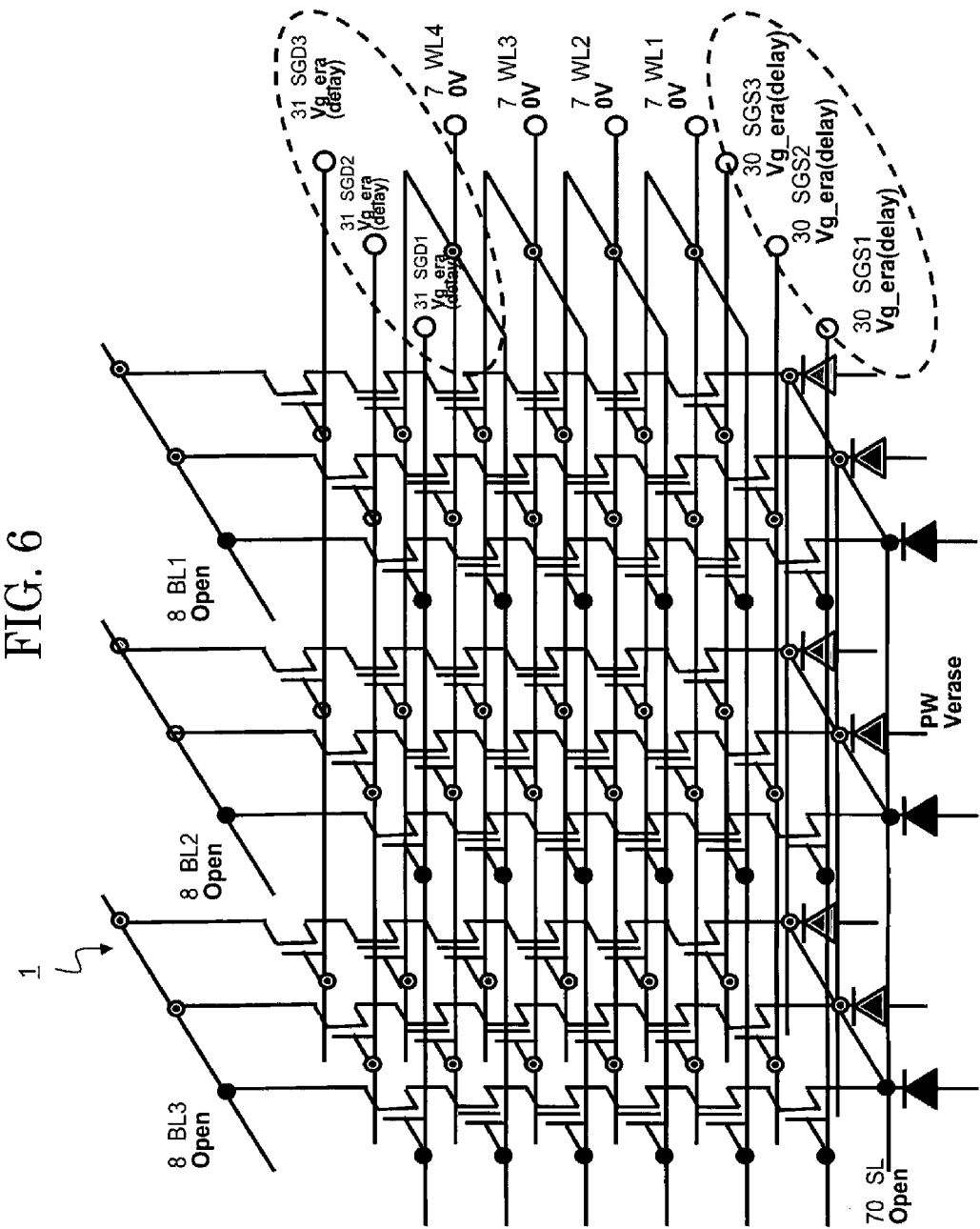
FIG. 6 is a diagram that shows a bias state of the selected block in the case that erasing operation of the data of the memory transistor MTr of the selected block is performed, in the nonvolatile semiconductor memory device 1 according to one embodiment of the present invention.
Figure 7:
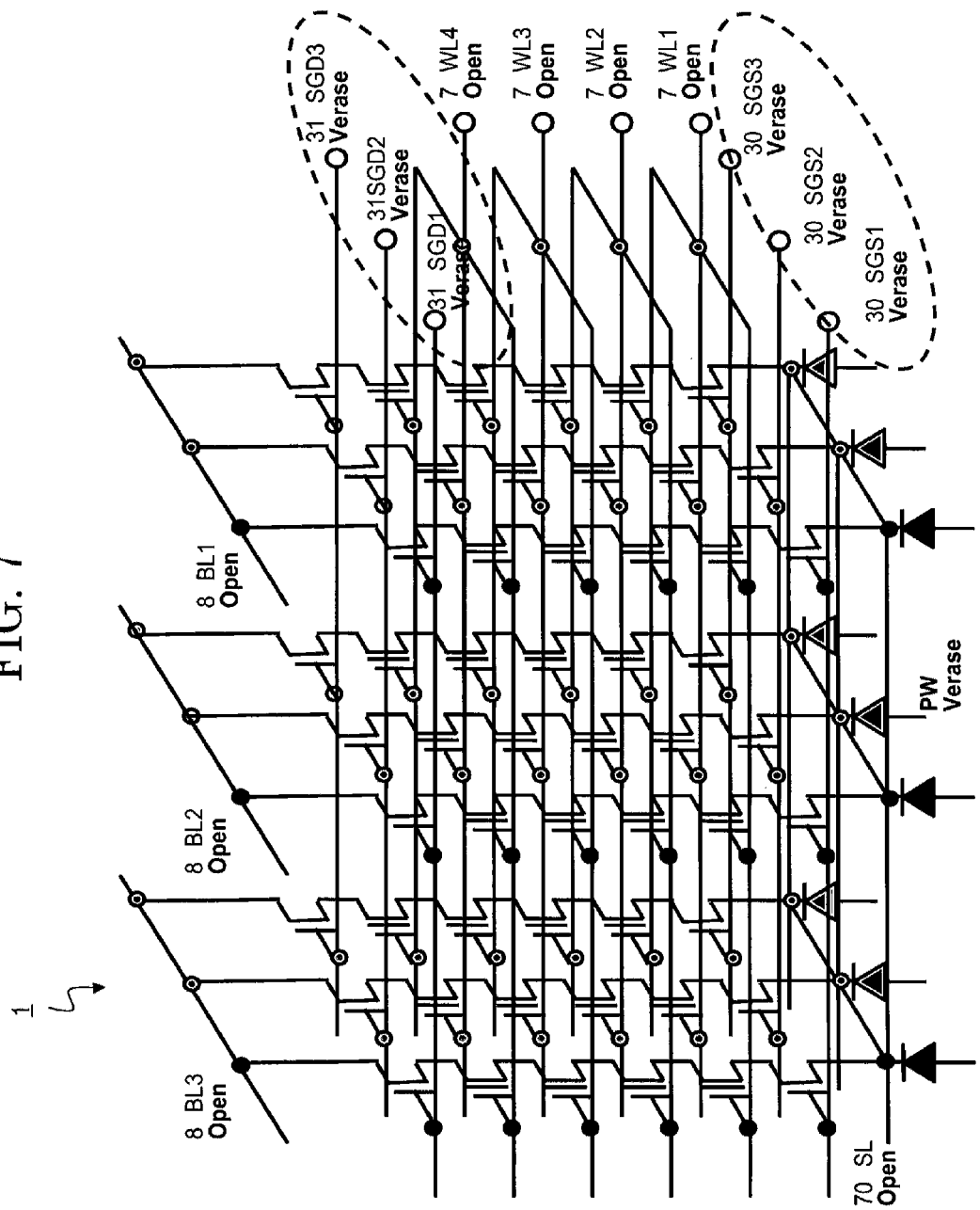
FIG. 7 is a diagram that shows a bias state of the non-selected block in the case that erasing operation of the data of the memory transistor MTr of the selected block is performed, in the nonvolatile semiconductor memory device 1 according to one embodiment of the present invention.

At the time of data erasing, data erasing of the memory transistors MTr1mn to MTr4mn is performed in block units including a plurality of memory strings 10. FIG. 6 shows the bias state of the selected block of the nonvolatile semiconductor memory device 1 according to the first embodiment of the present invention when the data erasing operation of the memory transistors MTr of the selected block is performed. FIG. 7 shows the bias state of the non-selected block of the nonvolatile semiconductor memory device 1 according to the first embodiment of the present invention when the erasing operation is performed.

In FIG. 6, in the selected block (the block desired to be erased), Verase (for example 20V) is applied to the P-Well area, the source line SL70 is set to floating, and the potential of the selection gate lines SGS30 and SGD31 is raised (for example, 15V) by slightly shifting the time with the timing of the application of Verase to the P-Well area (shifting about 4 μsec, for example). Thereby, if the potentials of the word line WL1 to WL4 are set as 0V for example, electrons in the charge storage layer are extracted into the P-Well, and thus data erasing of the memory transistors MTr may be performed because a potential near Verase is transmitted to the channel forming area (the body part) of the memory transistor MTr.

On the other hand, as shown in FIG. 7, in the non-selected blocks, the word lines WL1 (7) to WL4 (7) are made a floating state and therefore the potentials of the word lines WL1 (7) to WL4 (7) are raised by coupling. Therefore, there is no potential difference between the word lines WL1 to WL4 and the charge storage layers of the memory transistors MTr1 to MTr4, and thus, extraction of the electrons from the charge storage layer (data erasing) is not performed.

Here, the following table 1 shows the relation of the potential in the "reading operation", "programming operation", and "erasing operation" of the nonvolatile semiconductor memory device according to the first embodiment of the present invention.

TABLE 1

|  | Read | Write"0" | Write"1" | Erase (selection) | Erase (nonselection) |
|---|---|---|---|---|---|
| BL | Vbl | 0 | Vdd | Verase | Verase |
| SGD | Vdd | Vdd | Vdd | Vera del | Vera del |
| WL4 | Vread | Vpass | Vpass | 0 | open |
| WL3 | 0 | Vprog | Vprog | 0 | open |
| WL2 | Vread | Vpass | Vpass | 0 | open |
| WL1 | Vread | Vpass | Vpass | 0 | open |
| SGS | Vdd | Voff | Voff | Vera_del | Vera_del |
| SL | 0 | Vdd | Vdd | open | open |
| PW | 0 | 0 | 0 | Verase | Verase |

Manufacturing Method

Although a detailed explanation of the manufacturing method of the nonvolatile semiconductor memory device according to the first embodiment of the present invention will be explained below, the manufacturing method includes forming a lower selection gate layer, a memory cell layer and an upper selection gate layer for every layer, forming contact holes for every layer by PEP, and depositing amorphous silicon or polysilicon etc. in these holes so as to form channels and so on. Accordingly, the contact area of a channel of each layer can sometimes be reduced by a variation in processing size and/or misalignment of a contact. In addition, when memory plug holes, in which the channel of the memory cell layer is formed respectively, are formed by a photo etching process, it is difficult to process the holes perpendicularly due to a variety of causes such as a change in etching gas or removal of the deposit and film material. As a result, the diameter at the lower end of the hole becomes smaller and the hole may sometimes be formed in a forward tapered shape. This is so that many memory cell layers are stacked in order to realize an increase in particularly capacity and it is notable to the extent that the depth of the hole to be processed becomes deep.

Generally, when the contact area between amorphous silicon (or polysilicon) layers is reduced, resistance increases and the reliability of the nonvolatile semiconductor device is affected. Consequently, enlarging the diameter of the hole is given as a remedy. However, this remedy runs counter to the demands of miniaturization because the cell size becomes large. Thereupon, together with enlarging the diameter of the hole, the interval between holes is shortened and it is possible to conceive of a remedy which prevents an increase in cell size. However, because it is not possible to shorten the interval between holes less or more than the limit of an exposure device, this remedy is not realizable. In the nonvolatile semiconductor device according to the first embodiment of the present invention, by enlarging the diameter of the upper part of a hole by a process other than exposure, even if misalignment, for example, occurs, it becomes possible to reduce a reduction in the contact area.

A manufacturing process of the nonvolatile semiconductor memory device 1 according to the first embodiment of the present invention will be explained with reference to FIG. 8 to FIG. 17. In FIG. 8 to FIG. 17, a peripheral circuit area, in which a peripheral circuit area such as a word line driver circuit and a sense amplifier circuit etc. are formed, is shown on the left side, and the memory transistor area is shown on the right side. Also, in the memory transistor area, parts corresponding to an area A part, an area B part and a cross section of X-X' and Y-Y' of the nonvolatile semiconductor memory device 1 according to first embodiment of the present invention shown in FIG. 1 are shown.

Figure 8:
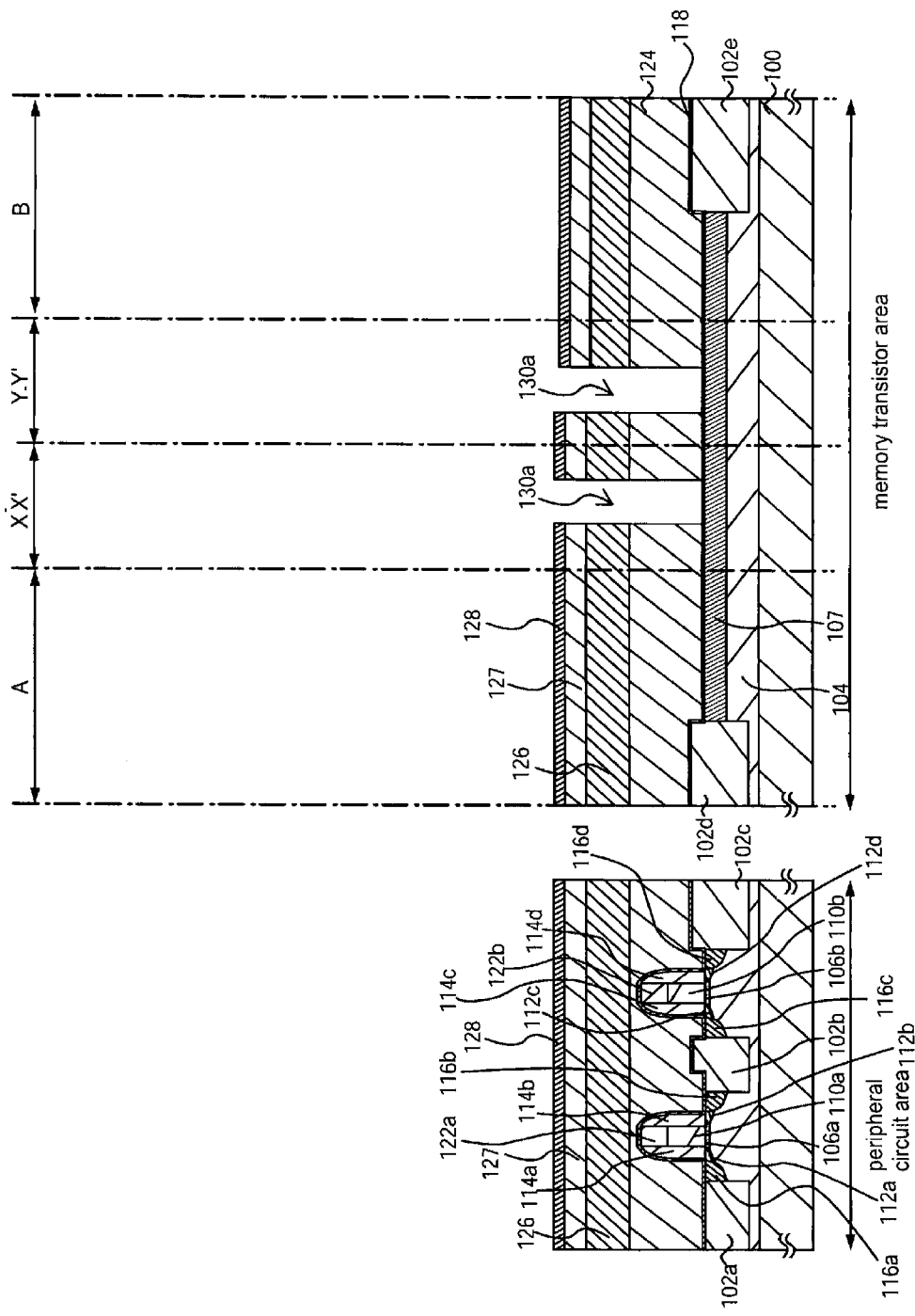
FIG. 8 is a diagram that shows a manufacturing process of the nonvolatile semiconductor memory device 1 according to one embodiment of the present invention.

Next, FIG. 8 is referred to. Element isolation regions STI102a, 102b, 102c, 102d and 102e are formed on the semiconductor substrate 100. Next, the P-well area 104 is formed by implanting boron (B) ions, and channel implant areas 106a and 106b, which adjust a threshold Vth of a transistor, are formed by implanting boron (B) ions near the surface of the substrate 100. Next, an n+ diffusion area 107 is formed by implanting phosphorous (P) ions in the memory cell transistor area. The n+ diffusion area 107 becomes the source line SL. Next, a polysilicon (poly-Si) film which includes conductive type impurities such as P (phosphorus) is formed on the substrate. And gate electrodes 110a and 110b of the transistor of the peripheral circuit area are formed by etching the polysilicon film. Next, the N-channel type areas 112a, 112b, 112c and 112d are formed by implanting P (phosphorus) ions or As (arsenic) ions etc., into the N-channel type transistor area in the peripheral circuit area. Next, a silicon nitride film is formed on the whole surface of the substrate and, side walls 114a, 114b, 114c and 114d are formed by etching the silicon nitride film by anisotropic etching. Next, the source/drain areas 116a, 116b, 116c and 116d are formed by implanting arsenic (As) ions into the N-channel type transistor area of the peripheral circuit area. Next, the source/drain areas (not shown) are formed by implanting boron (B) ions into the P-channel type transistor area of the peripheral circuit area. Next, a silicon nitride film (a barrier silicon nitride film) 118 is formed on the whole surface of the substrate. Next, cobalt silicide (CoSi$_2$) 122a and 122b are formed by the spattering method and heat treatment. Next, a BPSG film 124 is formed on the whole surface of the substrate by the widely known CVD method. Next, the amorphous silicon film (or the polysilicon film) 126, in which conductive type impurities such as the P (phosphorus) are added, is formed on the whole surface of the substrate. The amorphous silicon film (or polysilicon film) 126 becomes a selection gate line SGS of the memory transistor area. Next, the silicon oxide film 148 is formed using TEOS (Tetraethoxysilane). Hereinafter, the silicon oxide film that is formed using TEOS may be called "a TEOS film." And then, a silicon nitride film 128 is formed, and holes (hereinafter it may be called "transistor plug holes") 130a are formed by the photoresist process.

Figure 9:
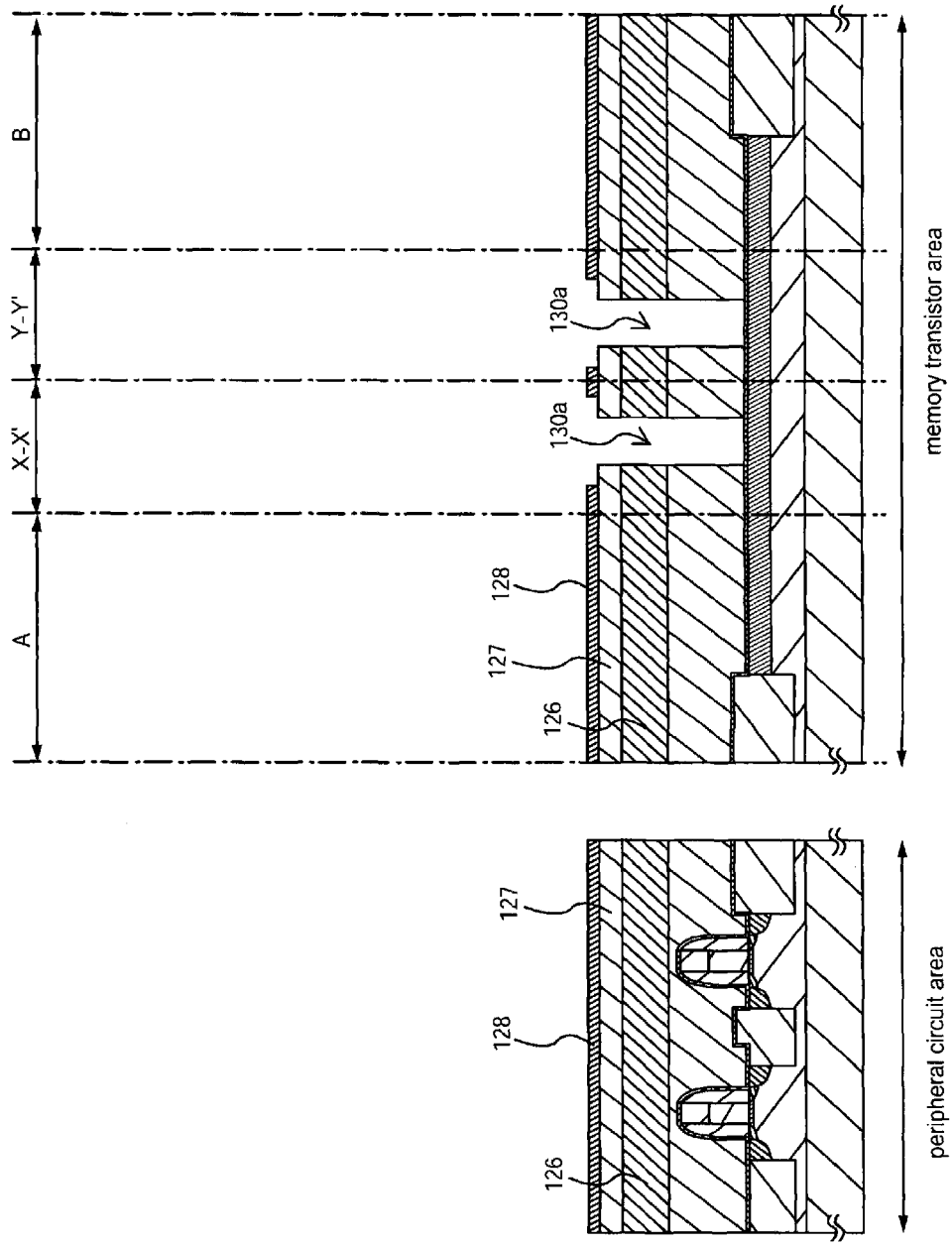
FIG. 9 is a diagram that shows a manufacturing process of the nonvolatile semiconductor memory device 1 according to one embodiment of the present invention.

After the transistor plug holes are formed by the method described above, the nitride silicon 128, which is the wall part of the transistor plug holes, is etched by wet etching using hot phosphoric acid etc. in order to enlarge the diameters of the upper parts of the holes. Thereby, the diameters of the upper parts of the holes are enlarged (FIG. 9). Here, etching is not limited to wet etching. The widely known dry etching process may be employed.

When the holes are processed by the PEP, as stated above, it is not possible to form the interval between adjoining holes smaller that the limit of the exposure device or less. However, by wet etching or dry etching, the diameter of the upper part of the hole can be enlarged even if the interval between adjoining holes is set as the limit of the exposure device or less. Therefore, the chip size can be miniaturized, and the capacity can be increased. Accordingly, in the nonvolatile semiconductor memory device according to the first embodiment of the present invention, the interval between adjoining holes, in which the diameters of the upper parts of the holes are enlarged, is equal to the limit of exposure device or less.

Figure 10:
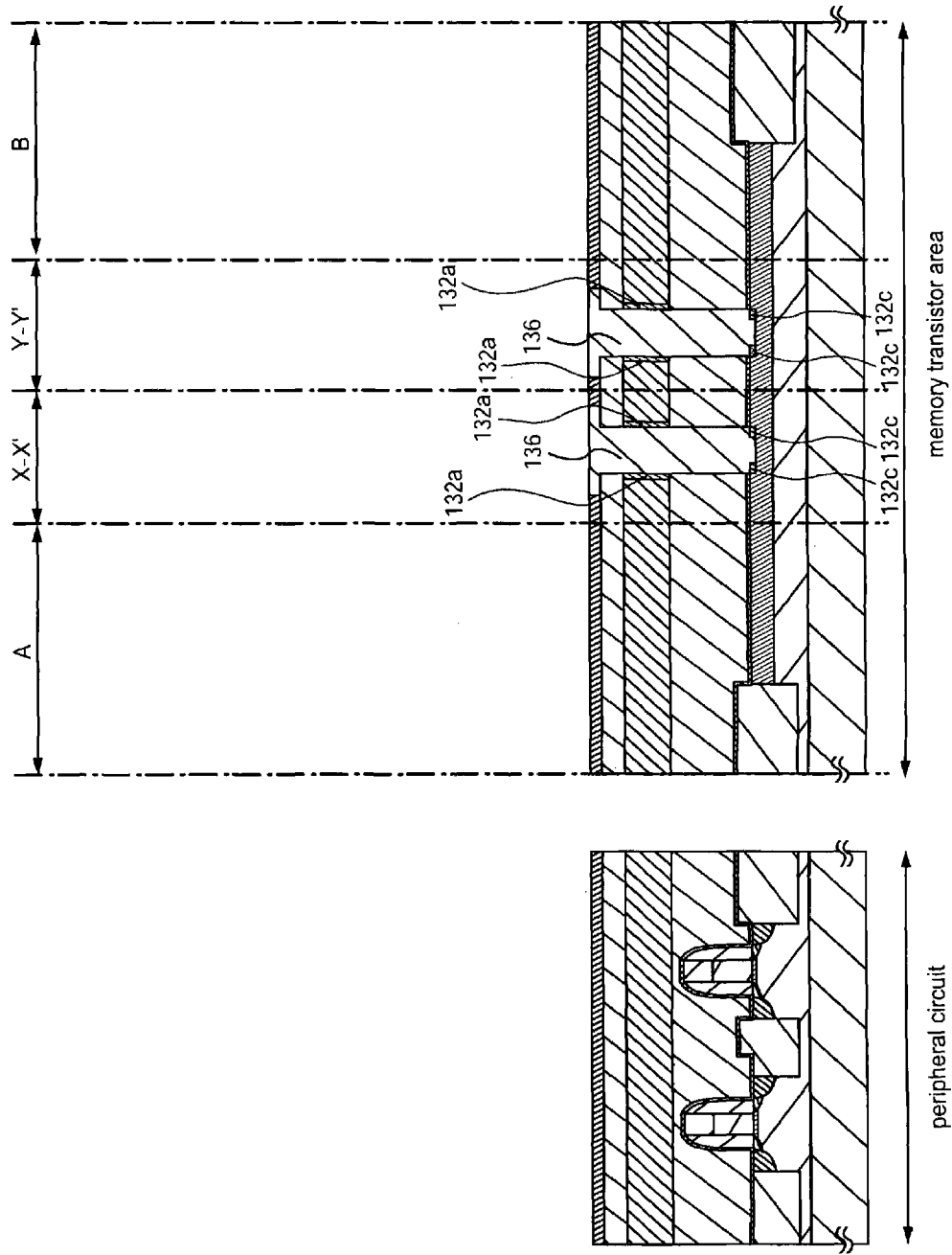
FIG. 10 is a diagram that shows a manufacturing process of the nonvolatile semiconductor memory device 1 according to one embodiment of the present invention.

Next, thermal oxidation films 132a are formed by heating the substrate. The thermal oxidation films 132a become the gate insulating films (the first gate insulating film) of the selection gate transistor SSTr. And then, after a block silicon nitride (not shown) is formed, one part of the thermal oxidation film positioned on the bottom of the holes is removed by wet etching or dry etching and the thermal oxidation film 132c is formed. Next, a block silicon nitride film 134 is removed, and an amorphous silicon (a-Si) film is formed on the whole surface of the substrate. Subsequently, pillar-shaped amorphous silicon layers (the first pillar-shaped semiconductor) 136 are formed by performing the CMP to the amorphous silicon film (FIG. 10). In addition, instead of the amorphous silicon film, a silicon layer may be formed by performing epitaxial growth on the single crystal silicon. And the pillar shaped amorphous silicon layer (the first pillar-shaped semiconductor) 136 may be formed by etching back the amorphous silicon film with the RIE (reactive ion etching) and planarizing it.

Figure 11:
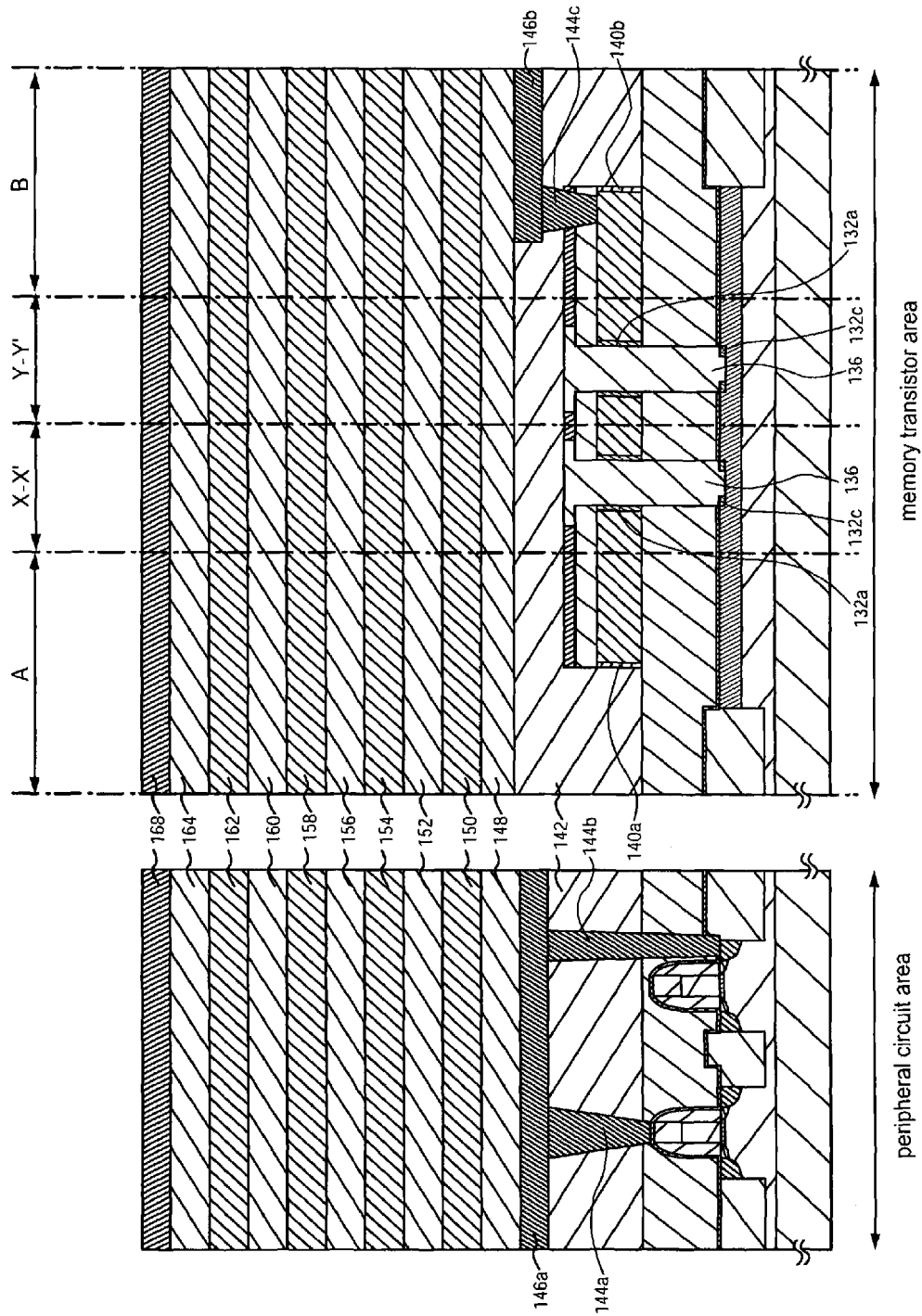
FIG. 11 is a diagram that shows a manufacturing process of the nonvolatile semiconductor memory device 1 according to one embodiment of the present invention.
Figure 12:
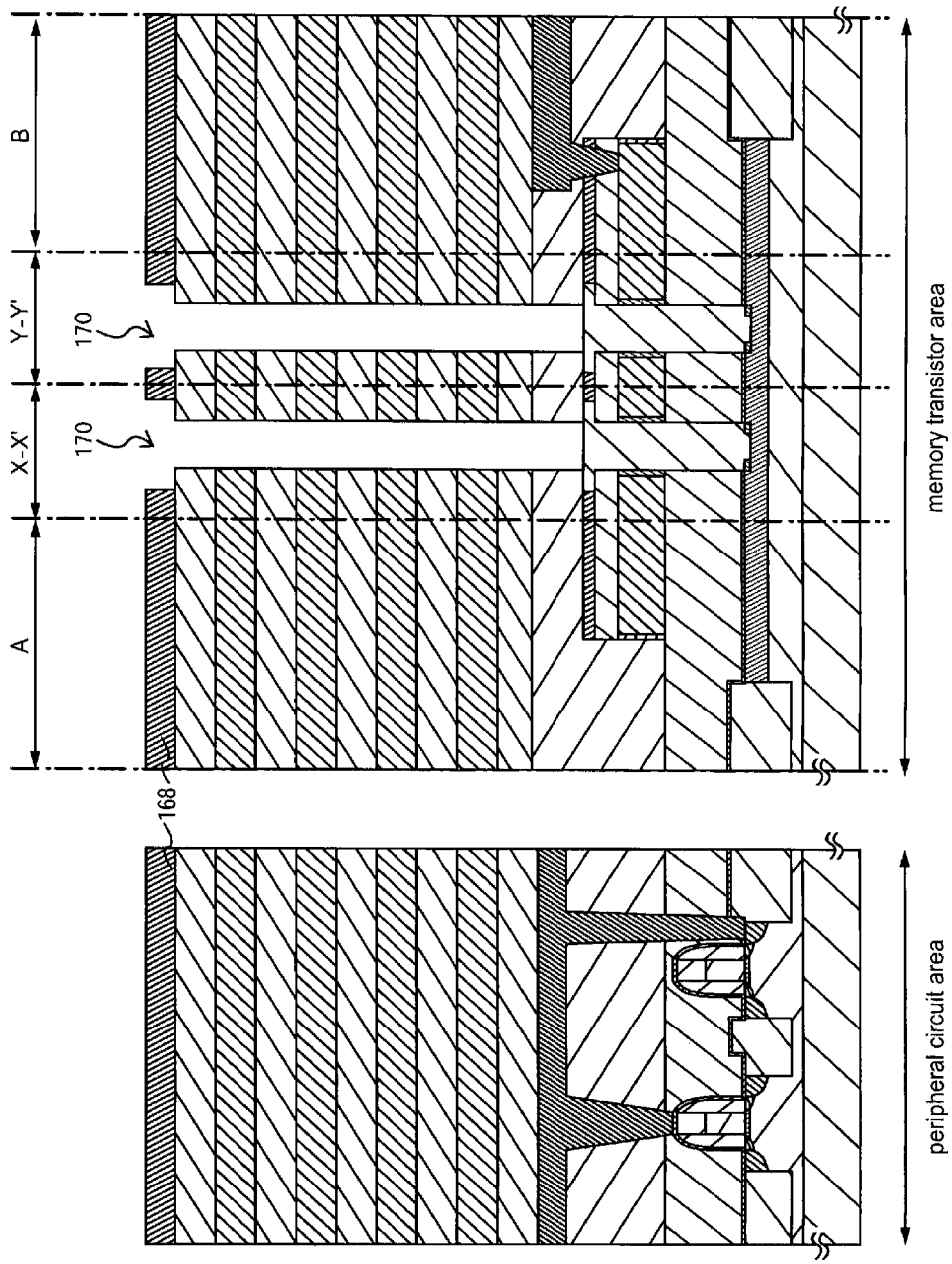
FIG. 12 is a diagram that shows a manufacturing process of the nonvolatile semiconductor memory device 1 according to one embodiment of the present invention.

Next, the memory transistor area is processed by the PEP, a titanium (Ti) film is formed, and then, titanium suicide (TiSi) 140a and 140b are formed by performing heat treatment on the titanium film. Here, instead of titanium silicide (TiSi), cobalt silicide (CoSi$_2$) may be formed. Next, the silicon oxide film 142 is formed as the premetal dielectric film (PMD). Next, slots for wiring are formed. Then, tungsten (W) plugs 144a, 144b and 144c and a wiring 146a and 146b are formed by embedding a tungsten (W) film in the slots and performing the CMP on the tungsten film. Next, the silicon oxide film 148 is formed using TEOS (Tetraethoxysilane). Next, the amorphous silicon films 150, 154, 158 and 162, and the silicon oxide films 152, 156, 160 and 164 are formed by forming amorphous silicon films (or poly-silicon films), in which conductive impurities such as P (phosphorous) etc. are added, and silicon oxide films, which are insulating films between control gates, in turns. Further, a silicon nitride film 168 is formed (FIG. 11). Here, in the present embodiment, an example, in which four amorphous silicon films are stacked, is described, however, the number of the amorphous silicon films and the silicon oxide films may be increased if needed. Next, in the memory transistor area, holes 170 are formed to form a pillar shaped semiconductor (a body part) of the memory transistor. (Hereinafter, the holes 170 are called "memory plug holes 170.") Next, the silicon nitride film 168, which is the wall part of the memory plug holes, is etched by wet etching using hot phosphoric acid etc. in order to enlarge the diameters of the upper parts of the holes (memory plug holes). Thereby, the diameters of the upper part of the holes are enlarged (FIG. 12). Here, etching is not limited to wet etching. The widely known dry etching process may be employed. Also, the silicon oxide film 164 is formed in order to prevent the amorphous silicon film 162 from being etched when the silicon nitride film 168 is processed by etching.

Figure 13A:
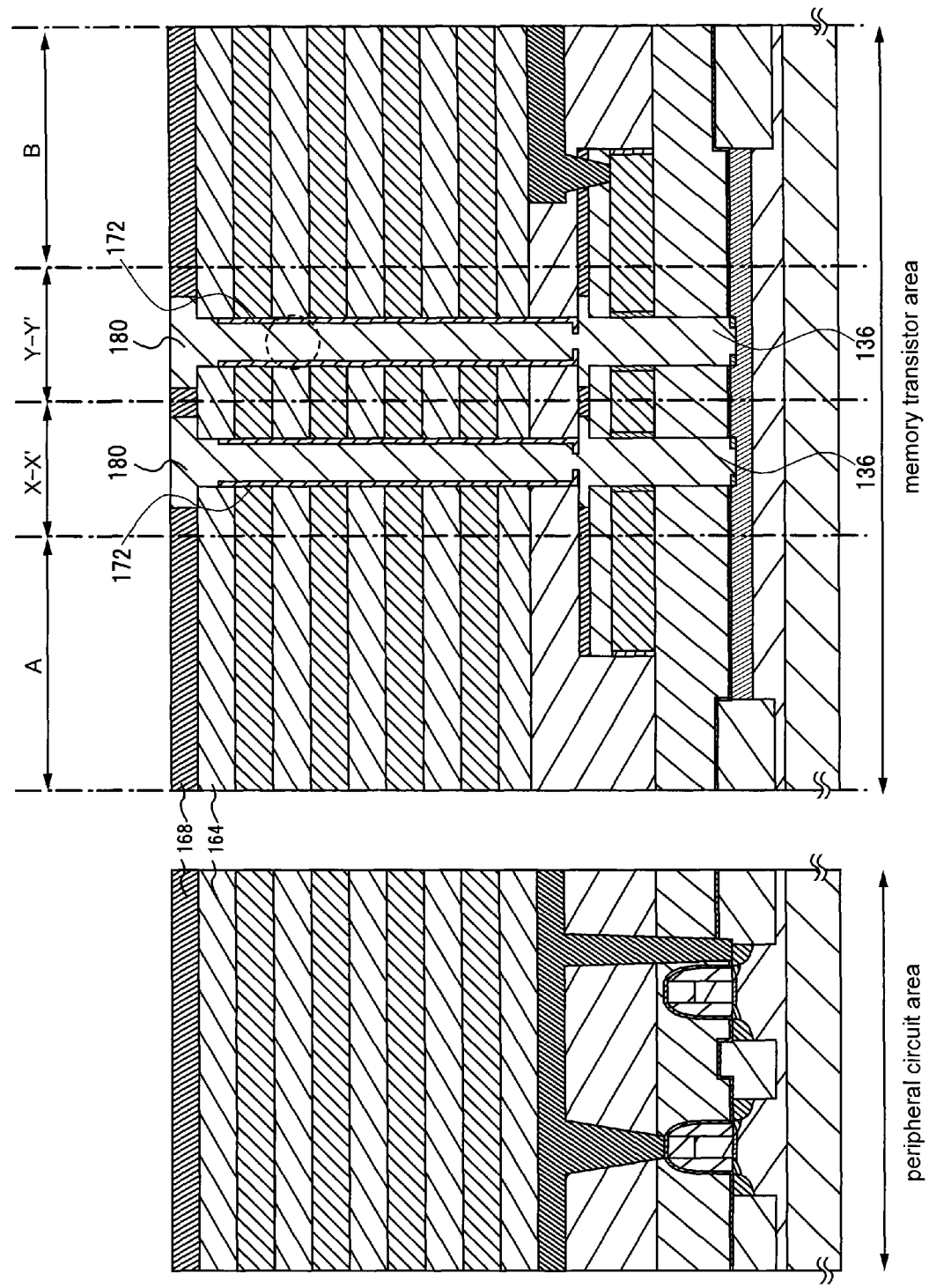
FIG. 13A is a diagram that shows a manufacturing process of the nonvolatile semiconductor memory device 1 according to one embodiment of the present invention.

Next, a first silicon oxide film (a first insulating film) 172a, a silicon nitride film 172b and a second silicon oxide film (a second insulating film) 172c are sequentially stacked, and thus, what is called an ONO film 172 is formed. The silicon nitride film 172b in the ONO film 172 becomes a charge storage layer of the memory transistor. Next, the ONO film is etched back so as to leave the ONO film 172 on the part other than the peripheral circuit region and the silicon nitride film 168 part which is positioned inside the holes. Next, a silicon nitride film is formed on the whole surface of the substrate, and spacer silicon nitride films are formed (not shown) by anisotropic etching. The ONO films 172 on the bottom of the holes and the spacer silicon nitride are etched back so as to conduct with the channel part 136 of the lower selection gate. After removing the spacer silicon nitride films 178, pillar shaped amorphous silicon layers 180 (the second pillar shaped semiconductor) are formed by forming an amorphous silicon film and performing CMP treatment (FIGS. 13A and 13B). The pillar shaped amorphous silicon layer (the second pillar shaped semiconductor) becomes a channel part of a memory cell. In addition, as well as the first pillar shaped semiconductor, instead of the amorphous silicon film, a silicon layer may be formed with an epitaxial growth.

Figure 14:
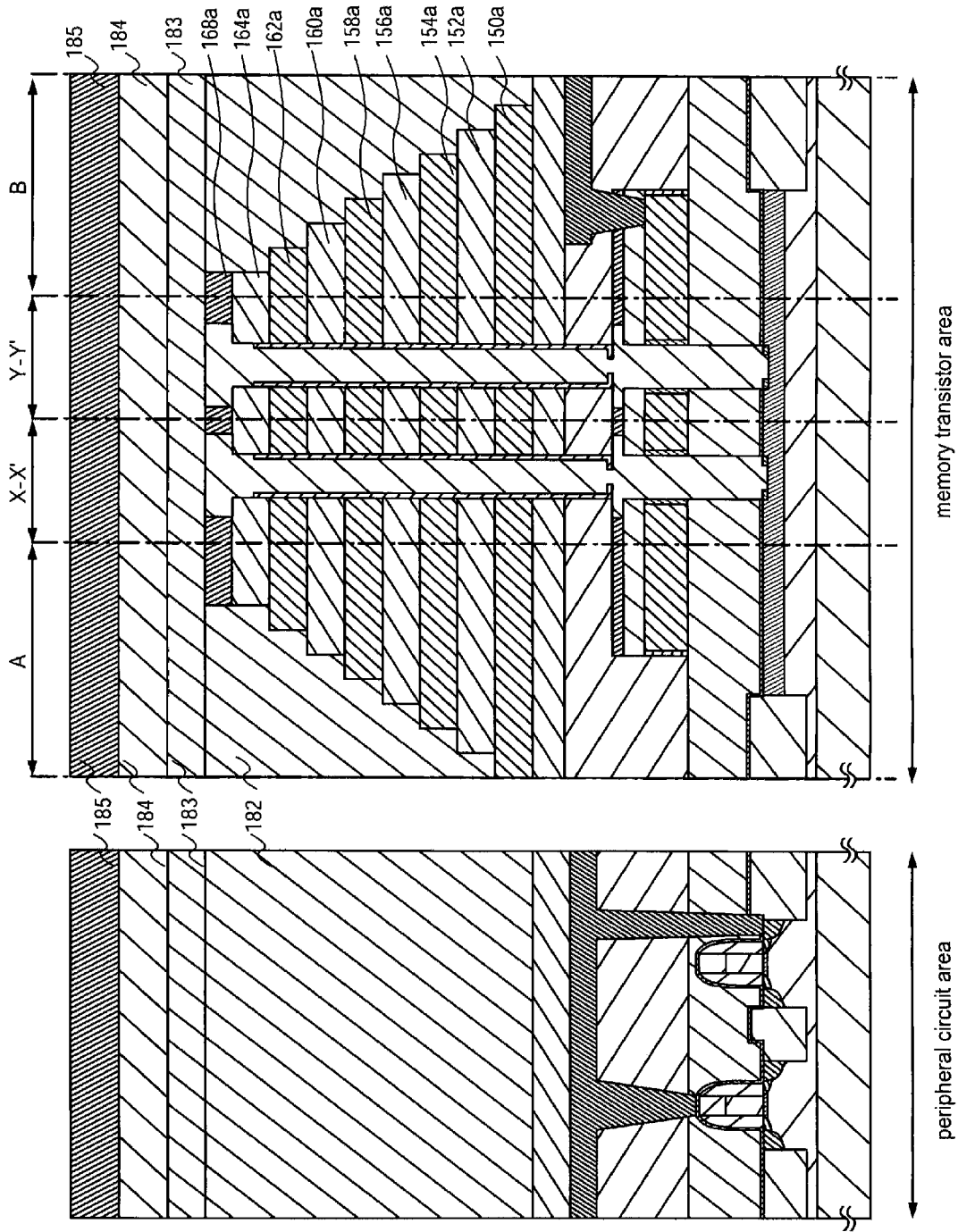
FIG. 14 is a diagram that shows a manufacturing process of the nonvolatile semiconductor memory device 1 according to one embodiment of the present invention.

Next, the silicon nitride film 168, polysilicon films 150, 154, 158 and 162, and the silicon oxide films 152, 156, 160 and 164 are etched in a tapered shape by repeating PEP and PEP while slimming photoresist. Thereby, the silicon nitride film 168a, polysilicon films 150a, 154a, 158a and 162a, and the silicon oxide films 152a, 156a, 160a and 164a are formed so that the edge parts of each film become stepwise shapes. Next, an interlayer insulating film (BPSG) 182 is formed. The interlayer insulating film (BPSG) 182 is planarized by CMP. Next, a silicon oxide film 183 is formed, and an amorphous silicon film 184 (or a plysilicon film) is formed on the silicon oxide film. The amorphous silicon film 184 becomes the selection gate line SGD of the memory transistor area. Additionally, a silicon nitride film 185 is formed on the amorphous silicon film 184 (FIG. 14).

Figure 15:
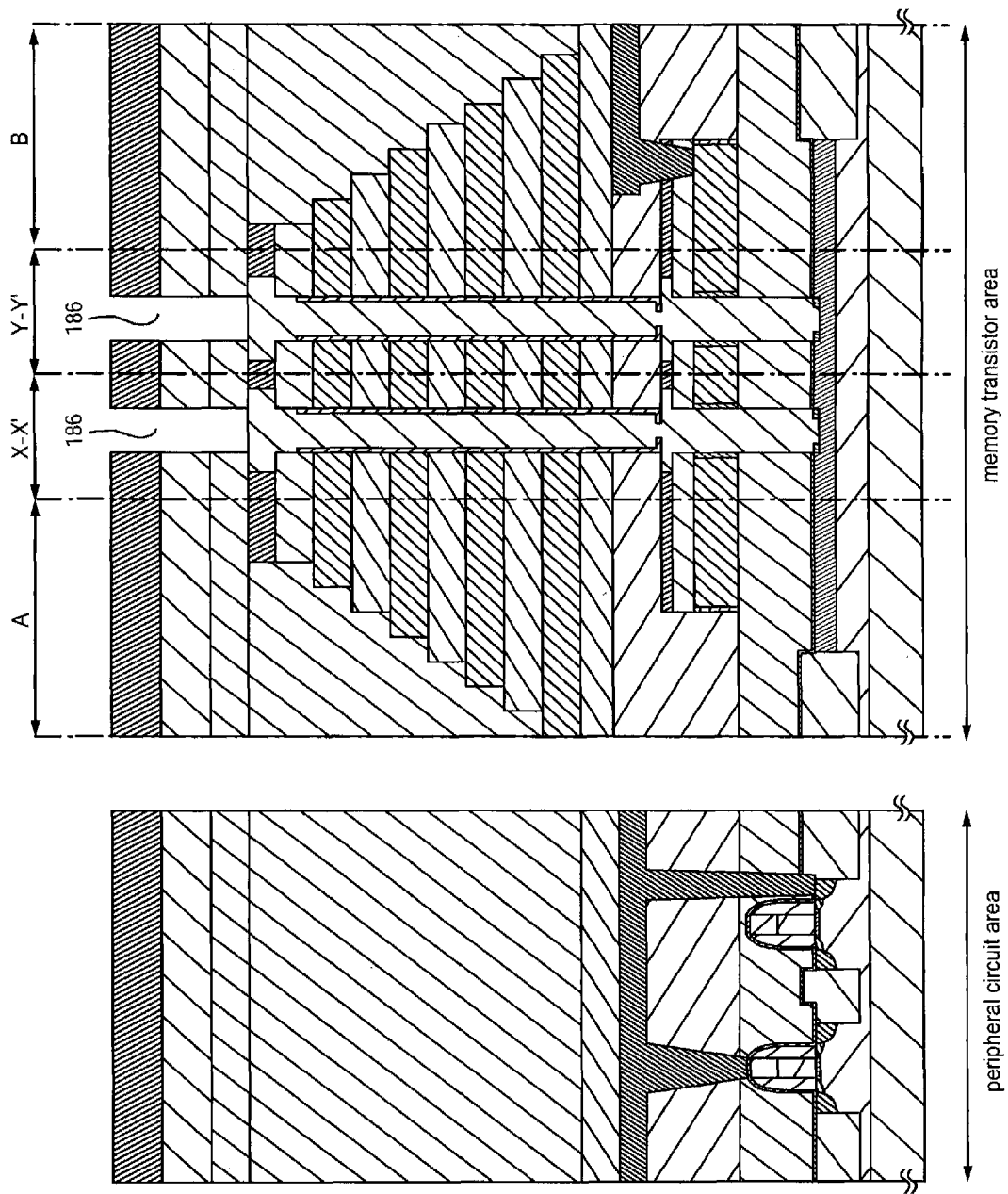
FIG. 15 is a diagram that shows a manufacturing process of the nonvolatile semiconductor memory device 1 according to one embodiment of the present invention.

Next, transistor plug holes 186 of the upper selection gate (SGD) layer are formed by PEP (FIG. 15).

By the variations of processing size and/or misalignment, the contact area of the channel formed in the transistor plug hole 186 of the upper selection gate layer and the channel formed in the memory plug hole 170 of the memory cell layer is reduced. However, because the diameter of the upper part of the memory plug hole 170 is has been enlarged (FIG. 12), as a result, the diameter of the upper part of the channel formed on the memory plug hole 170 is enlarged. Accordingly, it is possible to prevent a reduction in the contact area caused by variations of processing size and/or misalignment and thereby, it is possible to prevent an increase in the resistance due to this reduction the in contact area.

Figure 16:
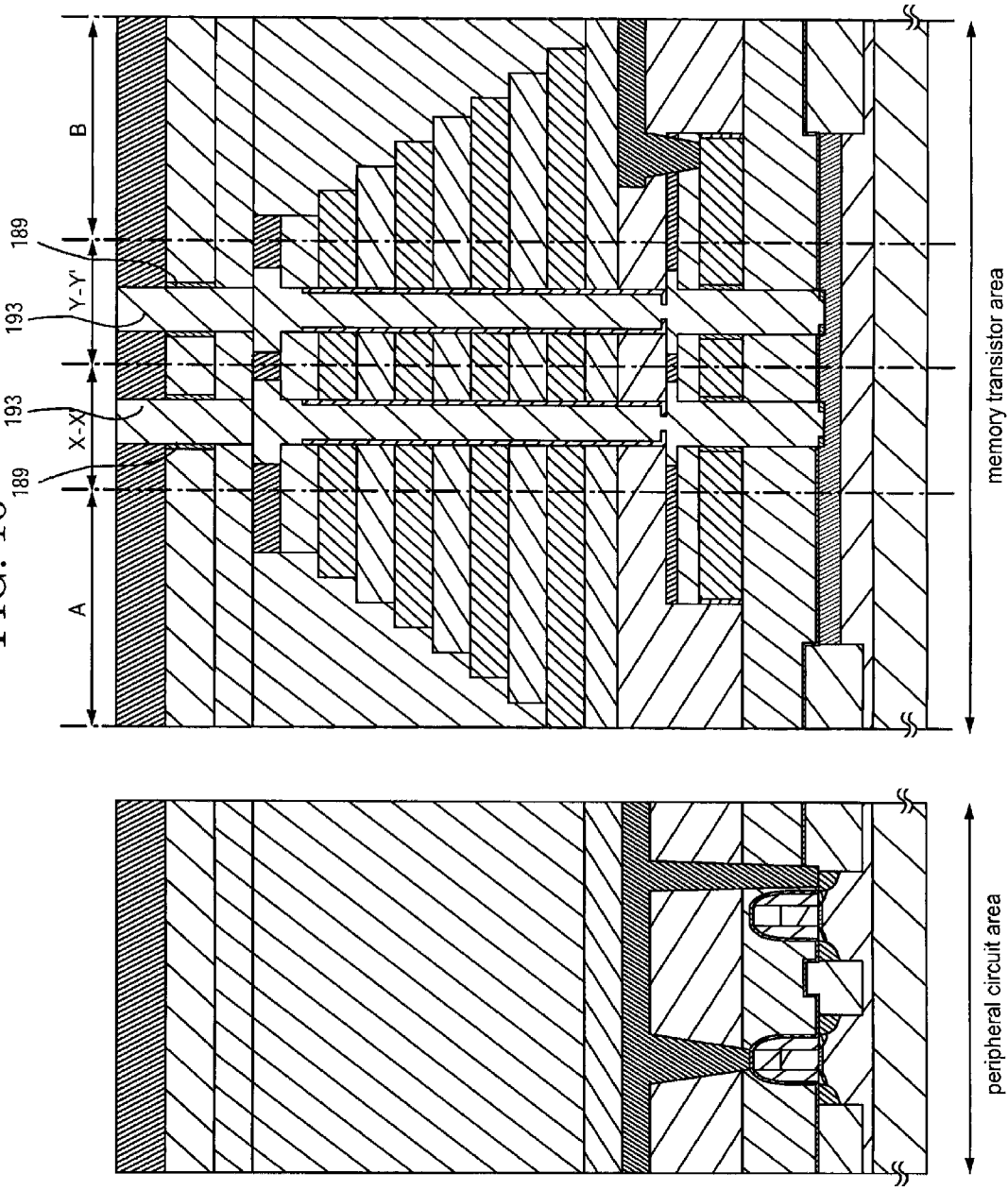
FIG. 16 is a diagram that shows a manufacturing process of the nonvolatile semiconductor memory device 1 according to one embodiment of the present invention.

Next, a thermal oxide film 189 is formed by heating the substrate. The thermal oxide film 189 becomes a gate insulating film (the second gate insulating film) of the upper selection gate transistor SDTr. Next, block silicon nitride films are formed in the transistor plug holes by anisotropic etching. The block silicon nitride films on the bottom of the holes are removed and the block silicon nitride films on the side wall of the holes are removed. And then, an amorphous silicon film is formed and processed by CMP. Thus, the pillar shaped amorphous silicon layers 193 (the third pillar shaped semiconductor) are formed (FIG. 16). The pillar shaped amorphous silicon layer (the pillar shaped semiconductor) 193 becomes a channel part of the upper selection gate transistor SDTr. In addition, instead of the amorphous silicon film, a silicon layer may be formed by epitaxial growth.

Figure 17:
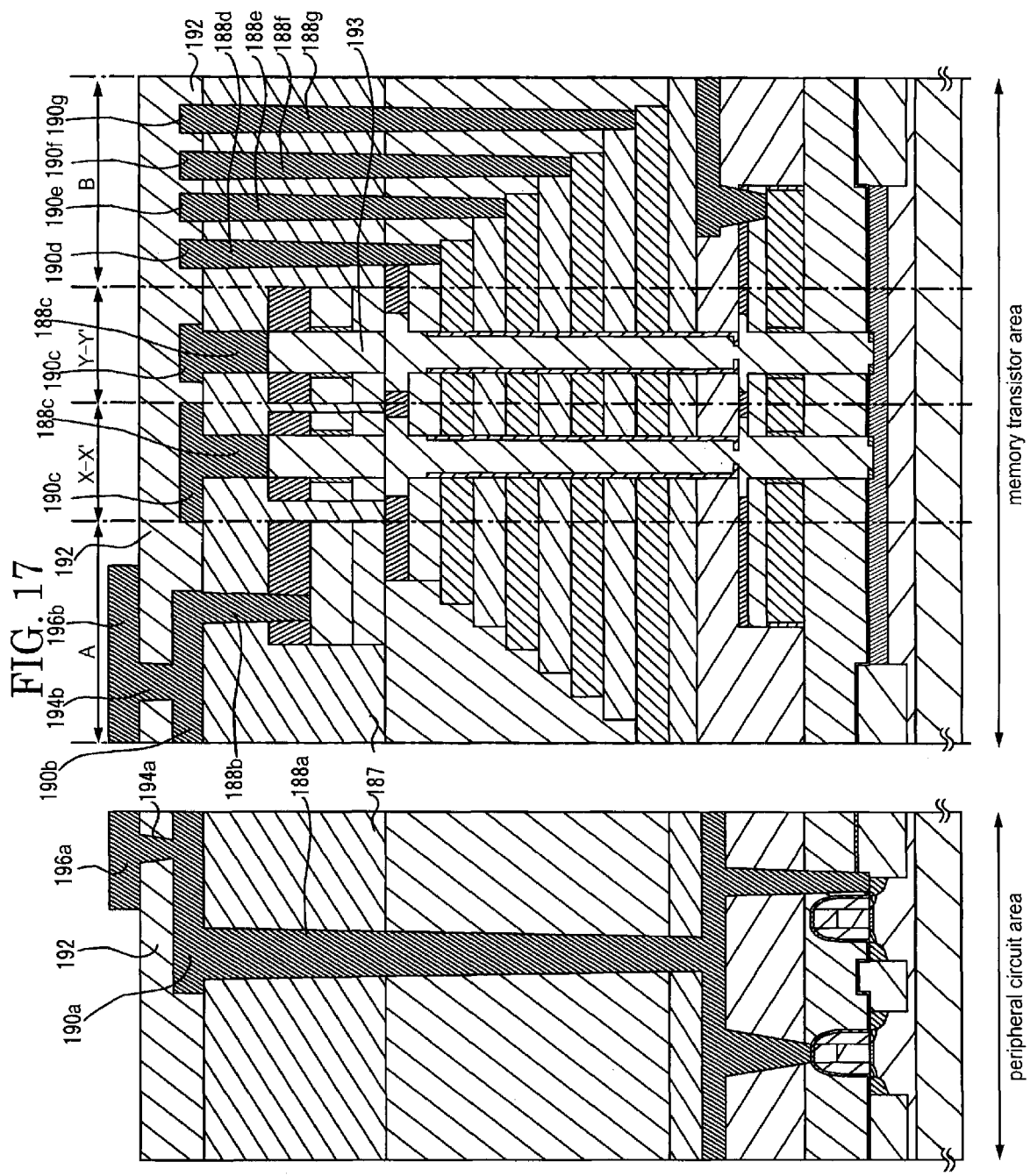
FIG. 17 is a diagram that shows a manufacturing process of the nonvolatile semiconductor memory device 1 according to one embodiment of the present invention.

Next, the upper selection gate transistor is separated by photo etching process. And a silicon oxide film 187 film is formed as the premetal dielectric (PMD) film. The silicon oxide film 187 is planarized by CMP. Next, contact holes are formed by PEP. Then, tungsten (W) plugs 188a, 188b, 188c, 188d, 188e, 188f and 188g are formed by embedding a tungsten (W) film in the contact holes and performing the CMP on the tungsten film. Next, an aluminum film is formed. And electrodes 190a, 190b, 190c, 190d, 190e, 190f and 190g are formed by the photo etching process. Subsequently, the interlayer insulating film (BPSG) is formed. The interlayer insulating film (BPSG) is planarized by CMP. Additionally, tungsten plugs 194a and 194b and aluminum electrodes 196a and 196b are formed by the same process as the process forming the tungsten plugs 188a to 188g and the electrodes 190a to 190g (FIG. 17).

Here, the contact area of the tungsten plug 188c and the pillar shaped amorphous silicon layer 193 which becomes the channel part of the upper selection gate layer may be reduced by variations of the processing size and/or misalignment. However, the resistance between the metal electrode of aluminum, for example, and the amorphous silicon, is small. As a result, even if the contact area is reduced and the resistance becomes large, the effects produced are not sufficient to influence the reliability of the device. Therefore, unlike the transistor plug holes of the lower selection gate (SGS) layer and the memory plug holes, there is no need to enlarge the diameter of the upper part of a transistor plug hole of the upper selection gate (SGD) layer.

By the above described processes, the nonvolatile semiconductor memory device 1 according to the first embodiment of the present invention may be manufactured.

As described above, in the nonvolatile semiconductor memory device, the diameters of the upper part of the transistor plug hole of the lower selection gate layer and the diameter of the upper part of the memory plug hole of the memory cell layer are enlarged. In other words, the diameters of the upper part of the channel, which is formed in the transistor plug hole, of the lower selection gate layer and of the upper part of the channel, which is formed in the memory plug hole, of the memory cell layer are enlarged. Accordingly, even if variations of processing size and/or misalignment occur, it is possible to prevent a reduction in each contact area and prevent an increase in the resistance. Next, the effects of the present invention will be explained using the drawings.

Figure 18:
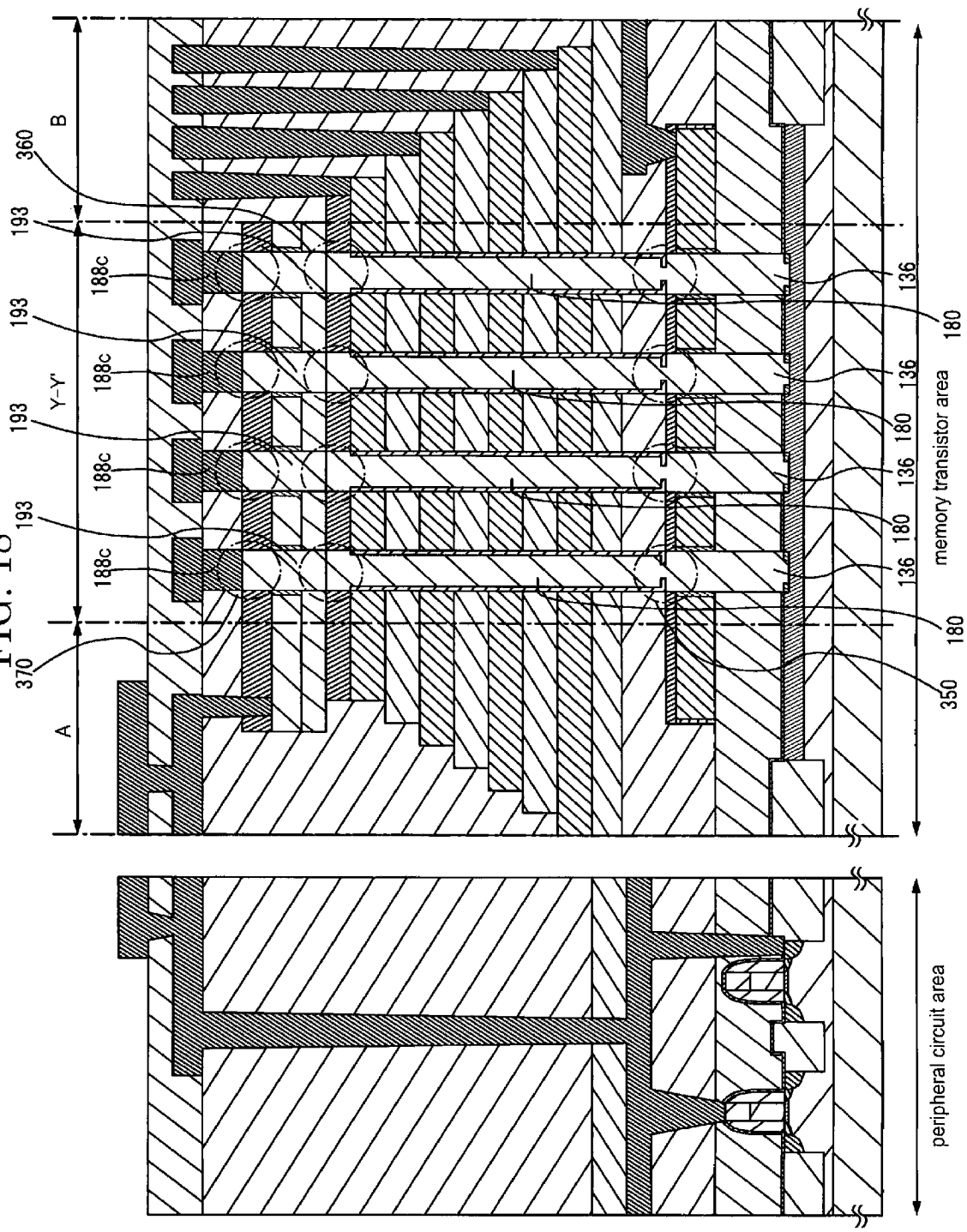
FIG. 18 is diagram that shows the normal alignment of the contact of the nonvolatile semiconductor memory device, in which the channels of the lower selection gate layer and the memory cell layer are formed with a fixed diameter.
Figure 19:
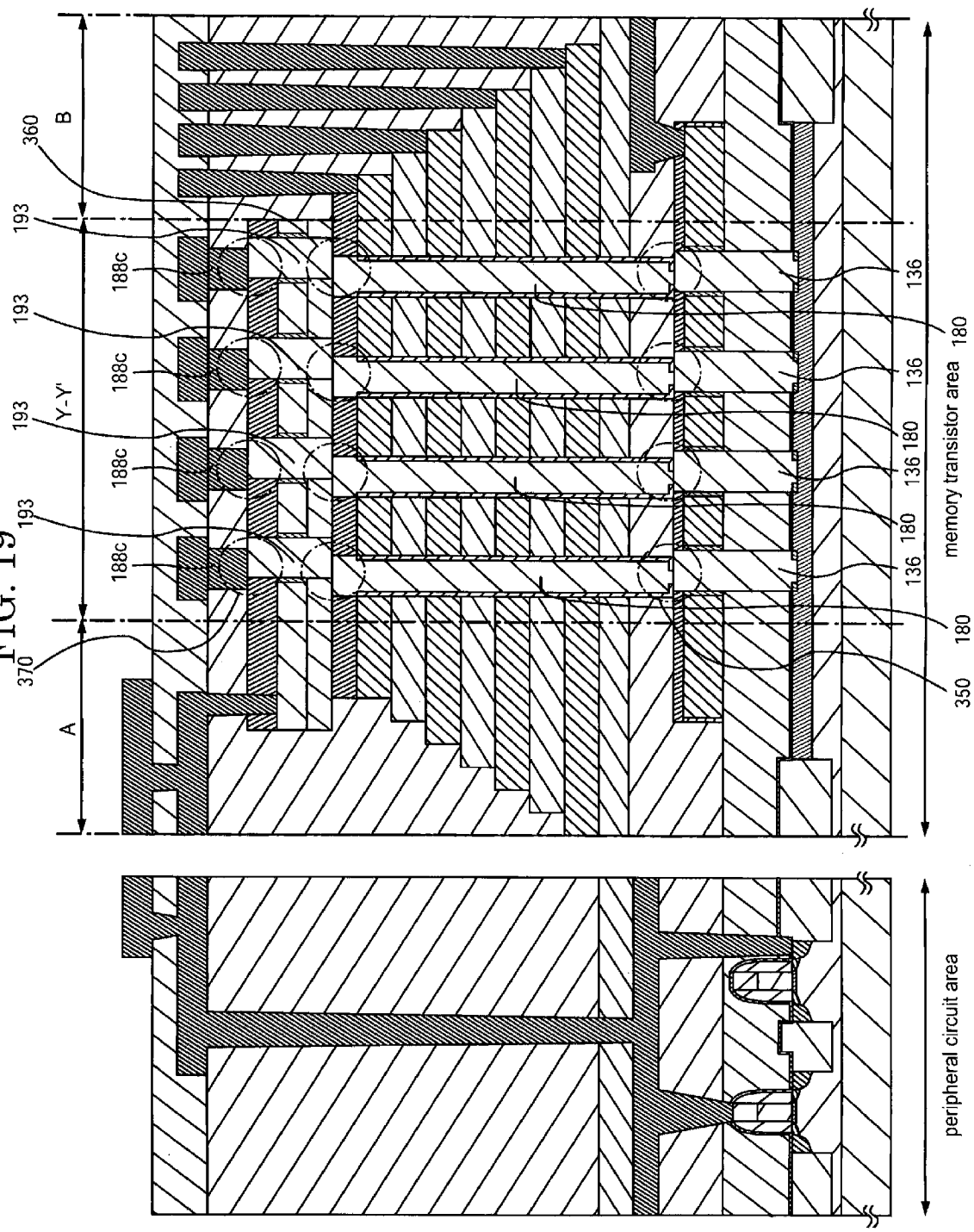
FIG. 19 is a diagram that shows the misalignment of the contact of the nonvolatile semiconductor memory device shown in FIG. 18.
Figure 21:
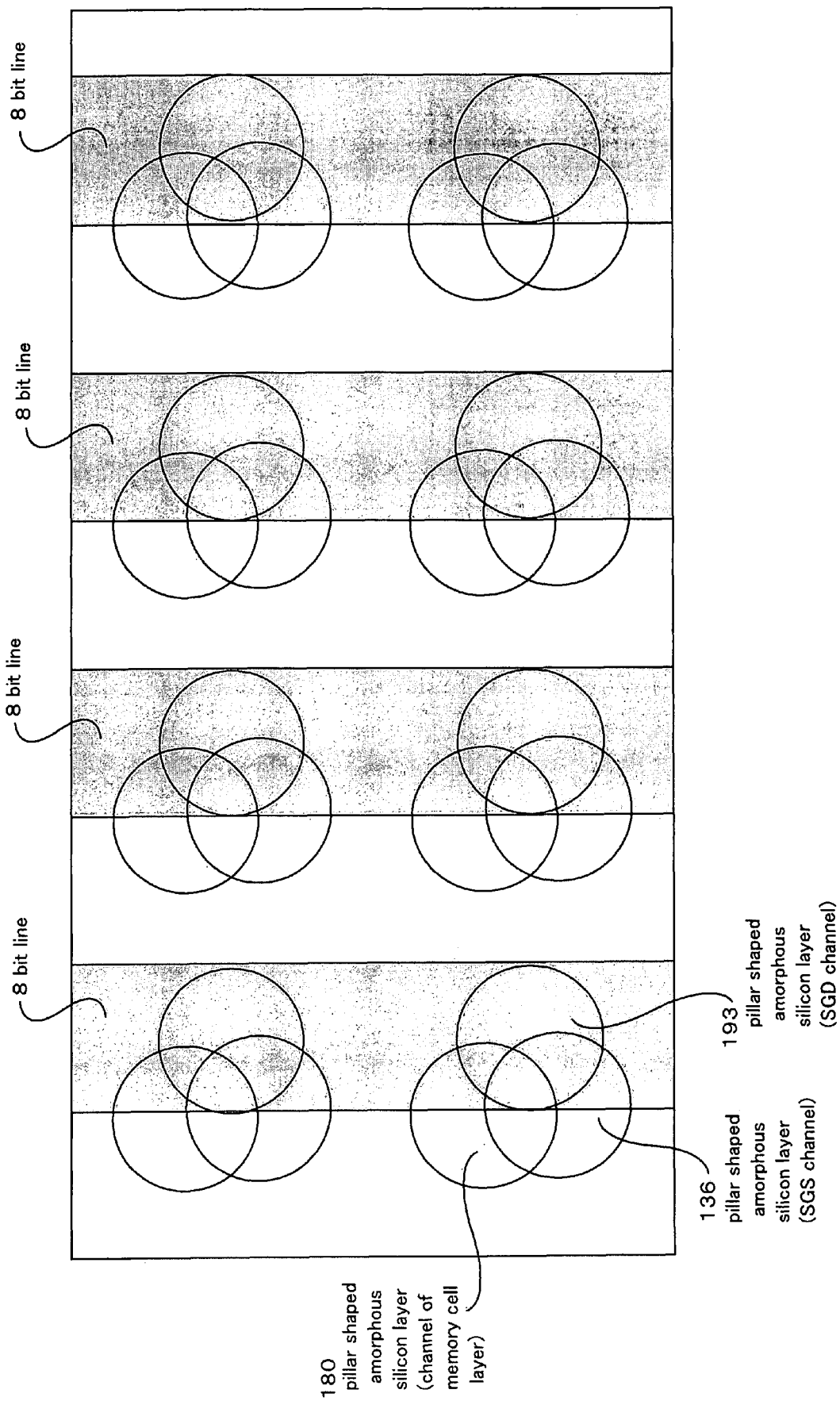
FIG. 21 is a plane surface typical diagram that shows the misalignment of the nonvolatile semiconductor memory device according to one embodiment of the present invention.

FIG. 18 to FIG. 21 are typical diagrams showing the alignment of the contact in the nonvolatile semiconductor memory device. FIG. 18 shows the normal alignment of the contacts in the nonvolatile semiconductor when the channels of the lower selection gate layer and the memory transistor layer have a constant diameter respectively. FIG. 19 shows the misalignment of the contacts in the nonvolatile semiconductor memory device shown in FIG. 18. FIG. 20 shows the misalignment of the contacts in the nonvolatile semiconductor memory device according to the first embodiment of the present invention. In FIG. 18 to FIG. 20, the peripheral circuit area is shown on the left side, and the memory transistor area is shown on the right side. Also, in the memory transistor area, parts corresponding to an area A part, an area B part and a cross section Y-Y' of the nonvolatile semiconductor memory device 1 according to first embodiment of the present invention shown in FIG. 1 are shown. FIG. 21 is a plane surface typical diagram showing the misalignment of the contacts in the nonvolatile semiconductor memory device according to the first embodiment of the present invention.

In FIG. 18, alignment 1 (350), which is an alignment of the lower selection gate layer (SGS) and the memory cell layer, alignment 2 (360), which is an alignment of the memory cell layer and the upper selection gate (SGD) layer, and alignment 3 (370), which is an alignment of the upper selection gate (SGD) layer and the metal wiring layer are shown, in which, the alignments 1 (350), 2 (360) and 3 (370) are arranged normally in accordance with standard settings.

On the other hand, in FIG. 19, the alignment 1 (350), 2 (360) and 3 (370) are misaligned to the right and left by the variations of the processing size and/or misalignment. In FIG. 19, the alignments 1 (350) are misaligned, however, the problems such as an increase in resistance do not occur because the contact area is fully maintained. However, the alignments 2 (360), which are the alignments of the pillar shaped amorphous silicon layers (the third pillar shaped semiconductor) 193 of the upper election gate (SGD) layer and the pillar shaped amorphous silicon layers (the second pillar shaped semiconductor) of the memory cell layer, are misaligned respectively, and as a result, the contact areas of the pillar shaped amorphous silicon layers 193 and 180 are reduced by about a half. The resistance between silicones is increased when the contact area of the silicones is reduced. Therefore, it becomes difficult for the current to flow in the alignments 2 (360).

Also, in FIG. 19, the alignments 3 (370), which are the alignments of the pillar shaped amorphous silicon layers (the third pillar shaped semiconductor) 193 of the upper selection gate (SGD) layer and of the tungsten plugs 188*c*, are misaligned, and consequently, the contact areas of the pillar shaped amorphous silicon layers 193 and the tungsten plugs 188*c* are reduced. However, because originally the resistance between the silicon and the metal is small, even if the resistance increases due to a reduction in the contact area with the silicon and the metal, the effects are small.

A typical diagram of a plane surface view of this type of the misalignment, is shown in FIG. 21. In FIG. 21, the misalignment of the amorphous silicon layer 193 (third pillar shaped semiconductor) which is the channel of the upper selection gate layer (SGD), the amorphous silicon layer 180 (second pillar shaped semiconductor) which is the channel of the memory cell layer and the amorphous silicon layer 126 (first pillar shaped semiconductor) which is the channel of the lower selection gate layer (SGS) is simply shown. However, the misalignment of each layer is not limited to this, the misalignment can occur in any direction in a 360 degree plane. When a misalignment occurs, it is understood that the contact area of each layer has been significantly reduced.

In FIG. 20, the alignments 1 (350), the alignments 2 (360) and the alignments 3 (370) are misaligned as shown in FIG. 19. However, for example, the diameters of the upper part of the pillar shaped amorphous silicon layers (the second pillar shaped semiconductors) 180 are enlarged in the alignments 2 (360). Thereby, the contact areas between the amorphous silicon layers (the second pillar shaped semiconductors) 180 of the memory cell layer and the pillar shaped amorphous silicon layers (the third pillar shaped semiconductors) 193 of the upper selection gate (SGD) layer are maintained at a size almost the same as the area in the case of normal alignment even if the misalignment occurs as shown in FIG. 19. Accordingly, the contact area can be prevented from being reduced, and the resistance can be prevented from increasing even if the variations of processing size and/or misalignment occur. Further, in order to prevent a reduction in a contact area due to this type of misalignment, in the nonvolatile semiconductor memory device according to the first embodiment of the present invention, the diameter of the upper part of the transistor plug hole of the lower selection gate (SGS) layer and the diameter of the upper part of the memory plug hole of the memory cell layer are enlarged by about 15 to 20 mm. However, this is just one example, and is not limited to this. The amount of enlargement is decided according to processing accuracy etc.

In addition, in the embodiment described above, an explanation is given in the case where the lower selection gate layer, the memory cell layer and the upper selection gate layer are each formed separately. However, the present embodiment is not limited to enlarging the diameter of the most upper part of the hole in which the channel of the lower selection gate layer is formed and the diameter of the most upper part of the hole in which the channel of the memory cell layer is formed. In the case where the number of stacks of memory cell layers is increased in order to increase memory cell capacity and the memory cell layer is formed by dividing a plurality of times, the diameter of the upper part of a hole in which the channel of the lower selection gate layer is formed and the diameter of the upper part of all the holes in which the channel of the each memory cell layer which are formed separately may be enlarged. In other words, the diameter of all the upper parts of the channel of the first pillar shaped semiconductor and the channel of the second pillar shaped semiconductor which is formed a plurality of times are enlarged.

In the nonvolatile semiconductor memory device according to the first embodiment of the present invention, the contact area is prevented from being reduced by enlarging the diameters of the upper part of the transistor plug holes and the memory plug holes even if the variations of the processing size and/or the misalignment occurs. In addition, it is possible to form a plurality of vertical type transistors which are connected in series by 1 PEP and it is possible to form a series construction with the plurality of vertical type transistors which are connected in series to a selection gate at the same time as 1 PEP or 2 PEP (memory plug hole formation PEP). Further, it is possible to form a word line by a rough PEP. As a result, it is possible to realize a reduction in costs.

Also, in the nonvolatile semiconductor memory device according to the first embodiment of the present invention, when forming the lower selection gate (SGS) layer and the memory cell layer, a silicon oxide film is formed between an amorphous silicon layer (or a polysilicon layer) in which a channel is formed, and a nitride oxide film as an insulating film. When the diameter of the upper part of the transistor plug hole and the diameter of the upper part of the memory plug hole are enlarged, this silicon oxide film prevents the amorphous silicon layer (or a polysilicon layer) in which a channel is formed from being etched. That is, the silicon oxide film is used as a protection film of the amorphous silicon layer (or a polysilicon layer) at the time of etching. Therefore, it is possible to accurately enlarge the diameter of the upper part of hole by etching and as a result the silicon oxide film used as a protection film is effective in maintaining the reliability of the device.

Figure 22:
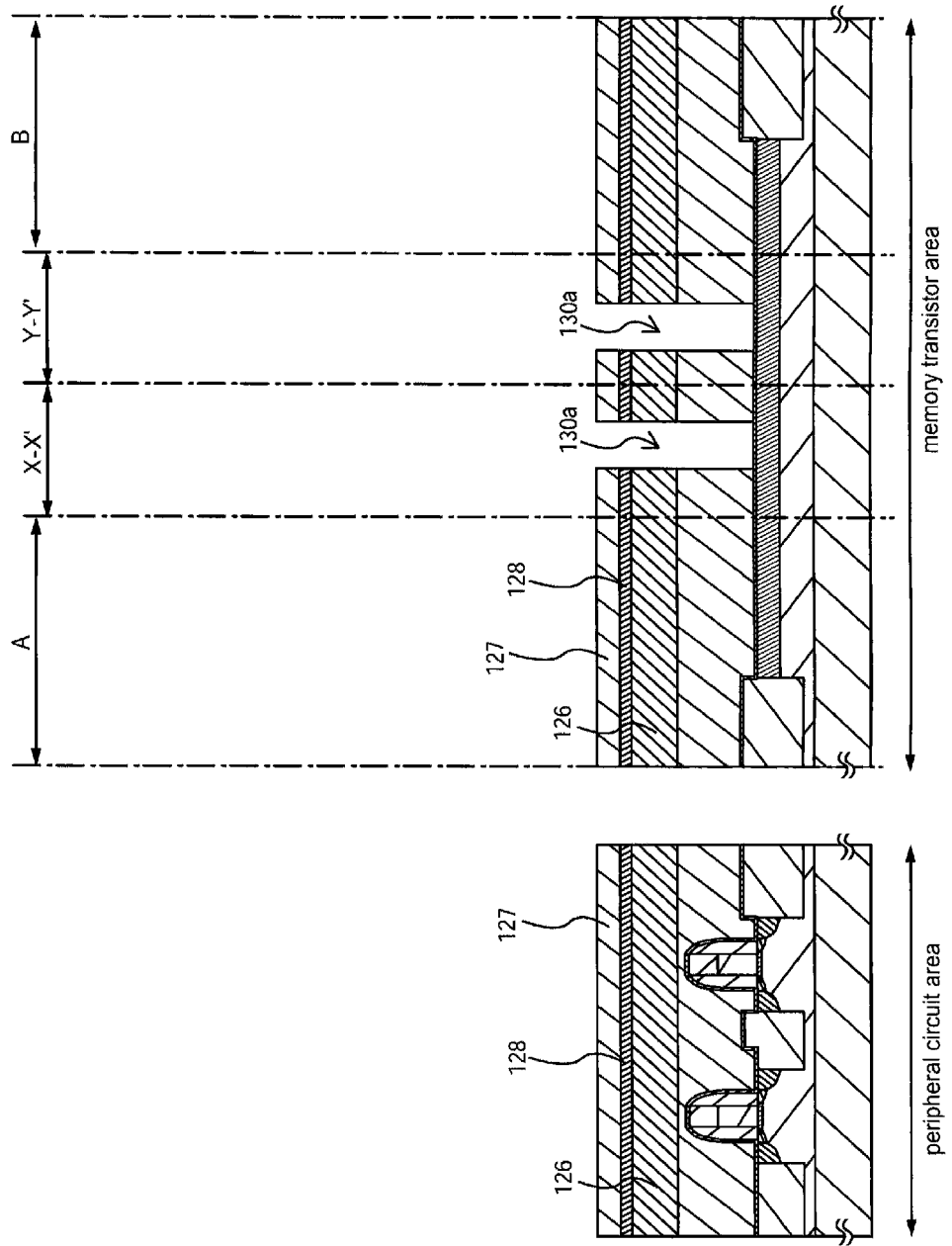
FIG. 22 is a diagram that shows another manufacturing process of the nonvolatile semiconductor memory device 1 according to one embodiment of the present invention.
Figure 23:
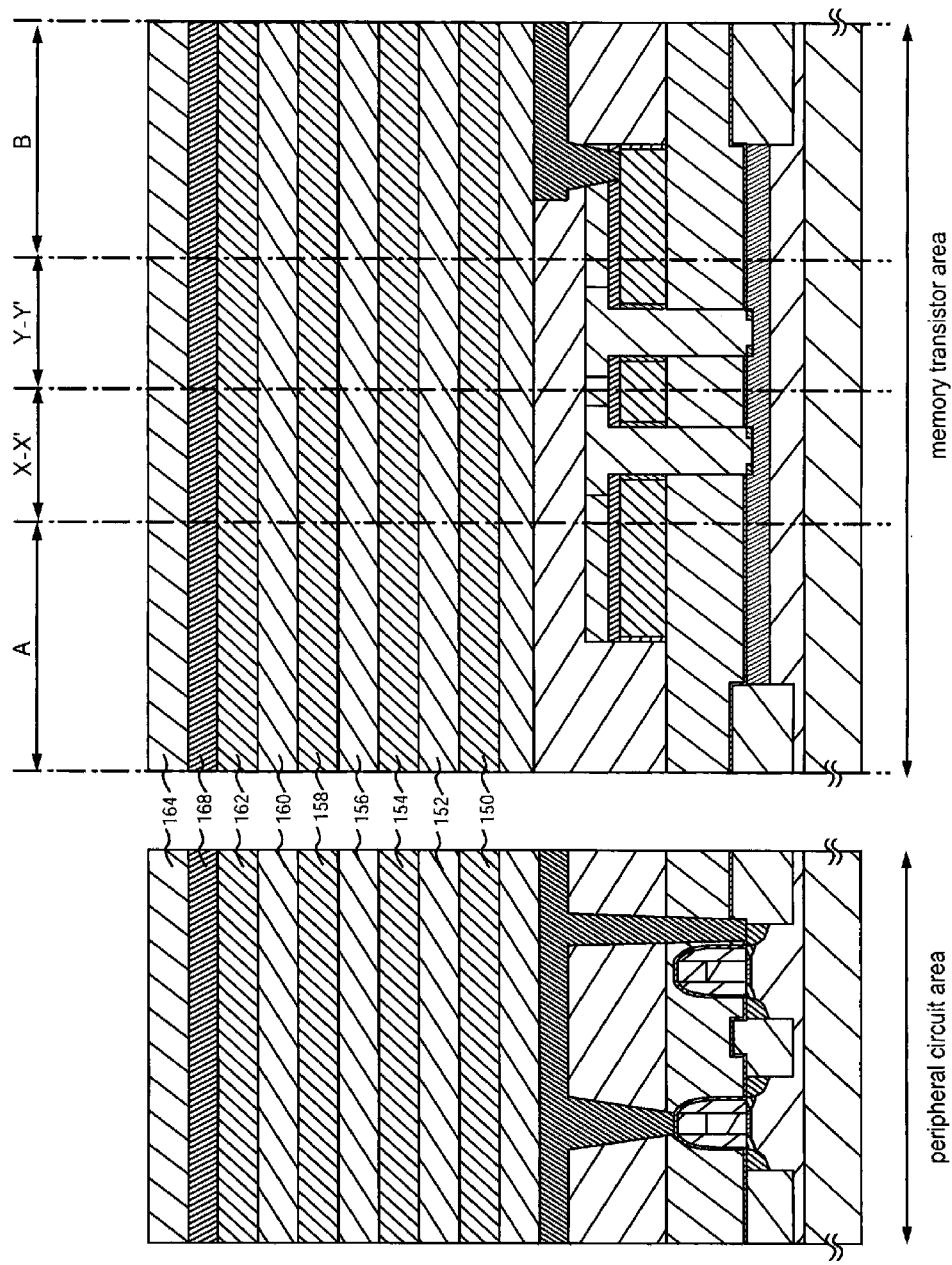
FIG. 23 is a diagram that shows another manufacturing process of the nonvolatile semiconductor memory device 1 according to one embodiment of the present invention.

In addition, in the manufacturing method of the nonvolatile semiconductor memory device according to the first embodiment of the present invention as described above, the silicon oxide film is formed on the amorphous silicon layer (or polysilicon layer) in which a channel of a lower selection gate layer and a channel of a memory cell layer is formed, and upon this, the silicon nitride film is formed as the insulating film. However, the purpose of the present invention can be attained even if the order in which the silicon oxide film and the silicon nitride film are formed is changed. That is, the silicon nitride film may be formed on the amorphous silicon layer (or polysilicon layer) in which a channel of a lower selection gate layer and a channel of a memory cell layer is formed, and upon this, the silicon oxide may be formed as the insulating film Specifically, in the process shown in FIG. 8 of the manufacturing process described above, the amorphous silicon film (or polysilicon film) 126, in which conductive type impurities such as the P (phosphorus) is added, is formed on the whole surface of the substrate, and then, the silicon nitride film 128 is formed on the whole surface of the substrate. Next, the silicon oxide film (TEOS film) 127 is formed (FIG. 22). In addition, in the process shown in FIG. 11, the amorphous silicon films 150, 154, 158 and 162 and the silicon oxide films 152, 156 and 160 are formed alternately. Next, the silicon nitride film 168 is formed on the amorphous silicon film 162, and the silicon oxide film 164 is formed on the silicon nitride film 168 (FIG. 23). Other processes are the same as the processes described above.

In the processes described above, the silicon oxide films (127 and 164) are etched by the widely known wet etching process or dry etching process in order to enlarge the upper parts of holes. At this time, the silicon nitride films (128 and 168) are positioned under the silicon oxide films (127 and 164) respectively. Because the silicon nitride films (128 and 168) respectively play the role of the protection film it is possible to prevent the amorphous silicon layers (or polysilicon layers) (126 and 162), which form channels respectively, from being etched directly. Accordingly, the purpose of the present invention can be attained even if the order in which the silicon oxide film and the silicon nitride film are formed is changed. And the reliability of the device is not affected.

Embodiment 2

As described above, the nonvolatile semiconductor memory device according to the first embodiment of the present invention has the structure in which the memory cells are stacked in three dimensions. In the nonvolatile semiconductor memory device according to the first embodiment of the present invention, the lower selection gate (SGS) layer, the memory cell layer and the upper selection gate (SGD) layer are formed for every layer, and they are stacked. And then, the metal wiring layer which includes the bit lines and so on is formed. At these times, the variation of the process size and/or the misalignment may occur. The variation of the process size and/or the misalignment may occur between the upper selection gate (SGD) layer and the metal wiring layer. As stated above, because there is silicon and metal between the pillar shaped amorphous silicon layer (or polysilicon layer) which forms the channel part of the upper selection gate (SGD) layer and the metal wiring layer, for example, between a metal plug such as tungsten plug etc the resistance is small. As a result, even if the resistance is increased by a reduction in the contact area between the silicon and metal, an effect to the extent that reliability of the device is damaged is not produced. Therefore, there is no need to enlarge the diameter of the upper part of the transistor plug hole in which the channel of the upper selection gate (SGD) layer is formed, and the transistor plug hole is formed at almost the same diameter by 1 PEP.

Figure 24:
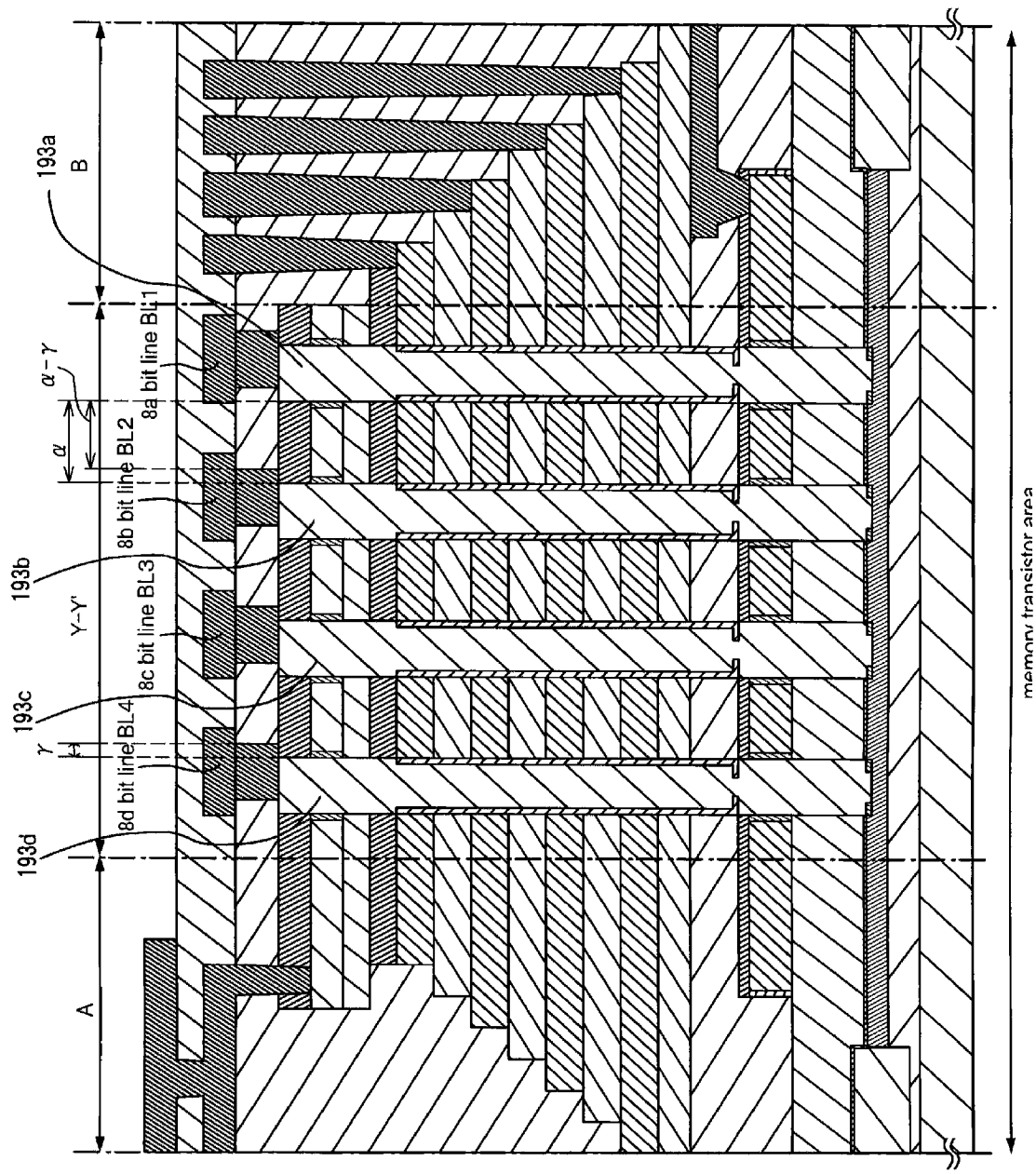
FIG. 24 is a diagram that shows the misalignment of the contact of the wiring layer of the nonvolatile semiconductor memory device in which the channels are formed with a fixed diameter.
Figure 25:
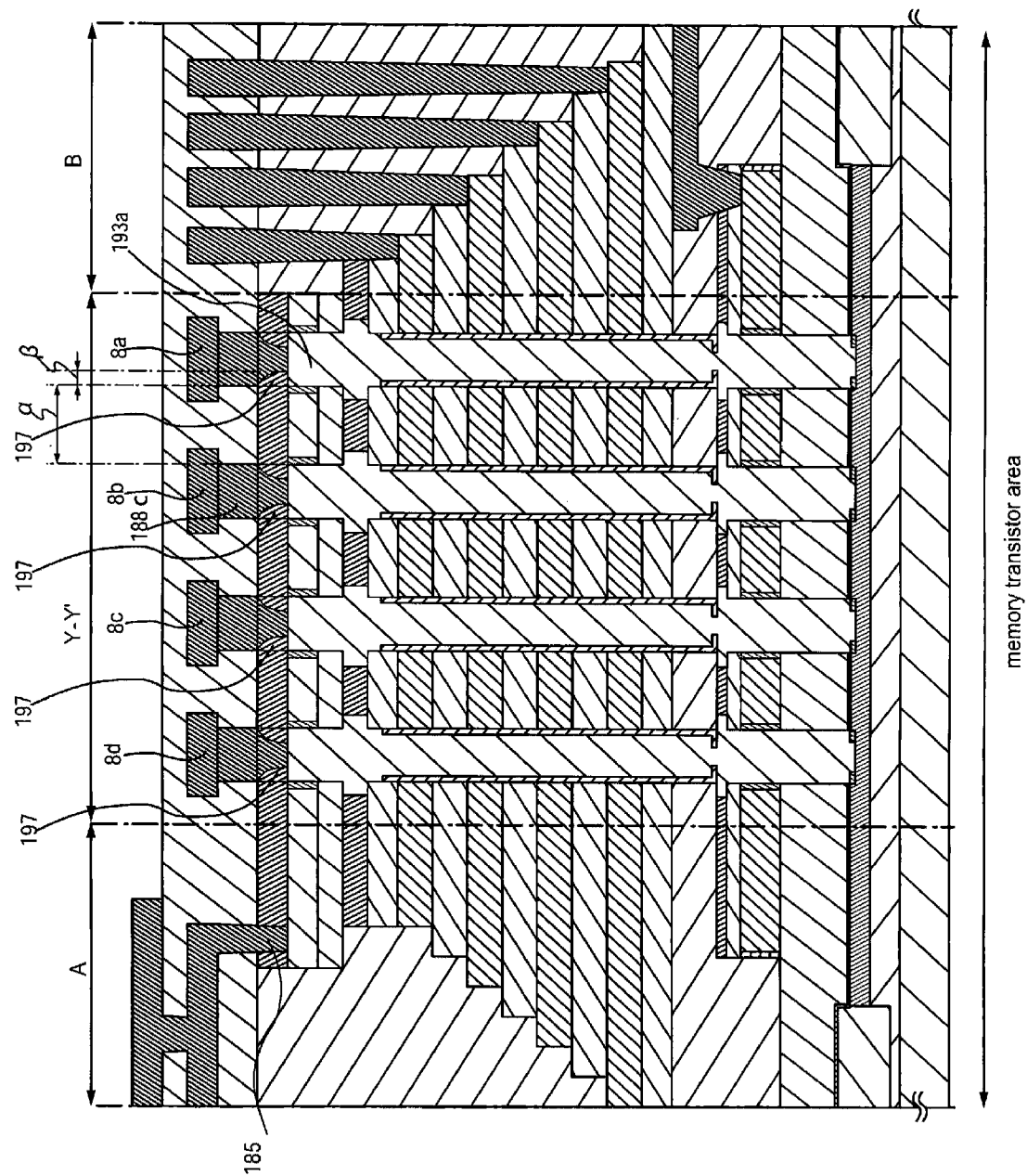
FIG. 25 is a diagram that shows the normal alignment of the contact of the wiring layer of the nonvolatile semiconductor memory device according to another embodiment of the present invention.
Figure 26:
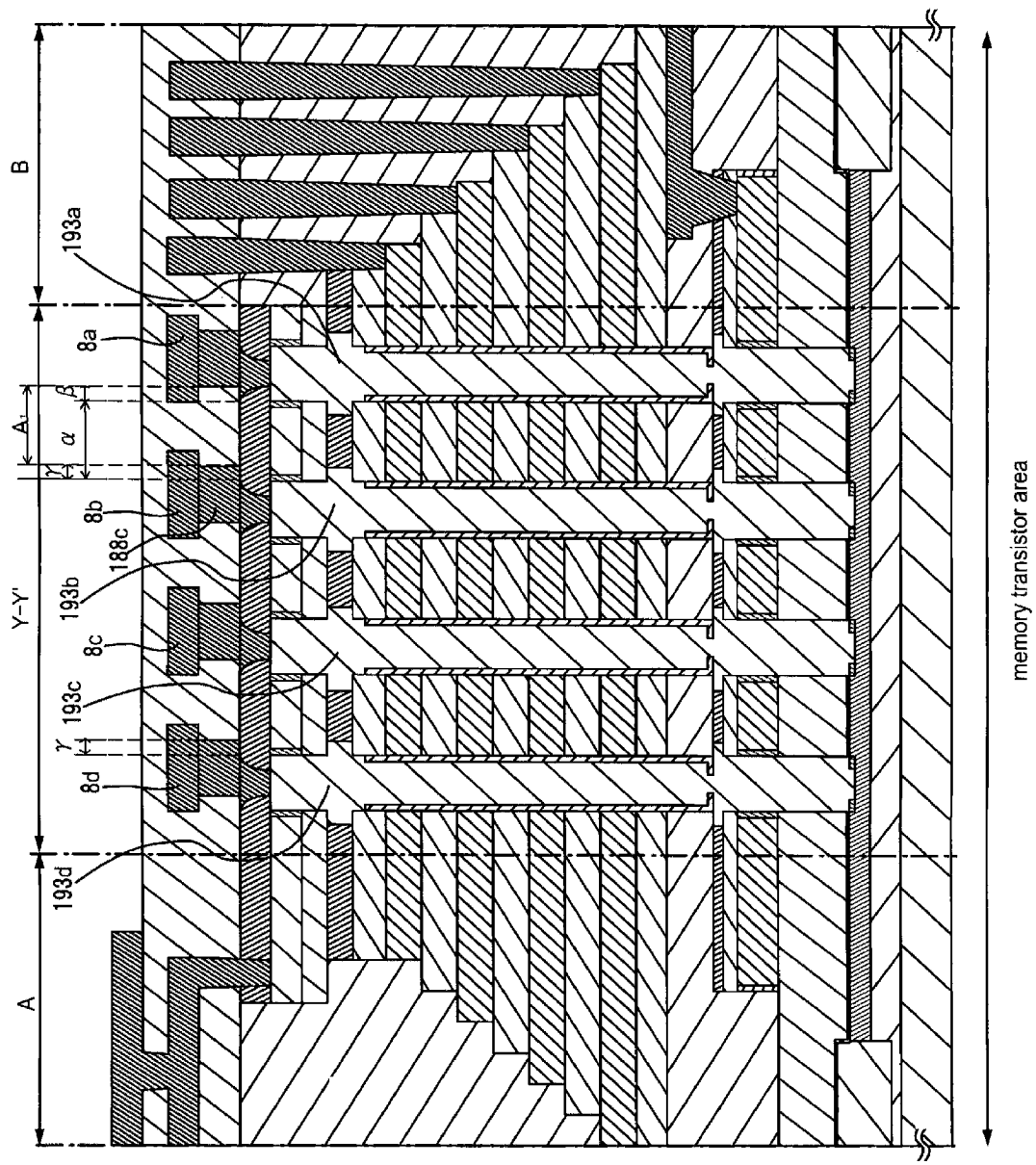
FIG. 26 is a diagram that shows the misalignment of the nonvolatile semiconductor memory device shown in FIG. 25.

However, on the other hand, the variation in process size and/or the misalignment raises the problem whereby a short margin between one bit line (or a tungsten plug which is connected to this bit line) and the pillar shaped amorphous silicon layer (may be the third pillar shaped semiconductor, a pillar shaped polysilicon layer) which is the channel part of the upper selection gate (SGS) layer which is connected to an adjacent bit line (or a tungsten plug which is connected to this bit line) deteriorates. This will be described based on the drawings. FIG. 24 is a drawing which shows the misalignment between the upper selection gate (SGD) layer and the metal wiring layer in the stacked type nonvolatile semiconductor memory device in which all the channels are formed at a fixed diameter. FIG. 25 is a drawing which shows the correct alignment between the upper selection gate layer (SGD) and the metal wring layer in the nonvolatile semiconductor memory device according to the second embodiment of the present invention. FIG. 26 is a drawing which shows the misalignment between the upper selection gate (SGD) layer and the metal wiring layer in the nonvolatile semiconductor memory device according to the second embodiment of the present invention. FIG. 24 to FIG. 26 show parts which are equivalent to a part of the region A and a part of the region B and a cross section Y-Y' in the nonvolatile semiconductor memory device according to the first embodiment of the present invention shown in FIG. 1.

FIG. 24 shows the state where the alignment between the upper selection gate layer (SGD) and the wiring layer is misaligned to the right facing the (drawing) by the distance part $\gamma$. Conventionally, in the nonvolatile semiconductor memory device, the interval a between one bit line BL8 and the pillar shaped amorphous silicon layer 193 (third pillar shaped semiconductor) which is the channel part of the upper selection gate layer connected to an adjacent bit line BL is set taking a sufficient short margin. However, in the case where variations in process size and/or misalignments occur, for example, in FIG. 24, the distance between the bit line BL2 (8b) and the pillar shaped amorphous silicon layer 193a (third pillar shaped semiconductor) which is connected to the adjacent bit line BL1 (8a) becomes $\alpha-\gamma$. If the distance $\gamma$ is more than the set short margin, then a short between the bit line BL2 (8b) and the pillar shaped amorphous silicon layer 193a (third pillar shaped semiconductor) is more likely to occur. Similarly, in the case where variations in process size and/or misalignments occur, a short is more likely to occur between the bit line BL4 (8d) and the pillar shaped amorphous silicon layer 193c (third pillar shaped semiconductor) and between the bit line BL3 (8c) and the pillar shaped amorphous silicon layer 193b (third pillar shaped semiconductor).

The nonvolatile semiconductor memory device according to the second embodiment of the present invention has silicon nitride spacers (silicon nitride films) on the upper part of the transistor plug hole in which the channel of the upper selection gate (SGD) layer is formed. By this, the short margin between one bit line and the pillar shaped amorphous silicon (third pillar shaped semiconductor) which is the channel part of the upper selection gate which is connected to an adjacent bit line, is appropriately secured. Therefore, even if variations in process size and/or misalignments occur, it is possible to effectively reduce a drop in the short margin between the metal wiring layer and the channel part of the upper selection gate (SGD) layer.

Next, the nonvolatile semiconductor memory device according to the second embodiment of the present invention will be explained based on the drawings. In FIG. 25, the diameter of the upper part of the transistor plug hole in which the channel of the lower selection gate (SGS) layer is formed and the diameter of the upper part of the memory plug hole in which the channel of the memory cell layer is formed are enlarged. Therefore, the diameters of the upper part of the channels of these two layers (that is, the first and second pillar shaped semiconductors) are large. This is to prevent an increase in the resistance where the contact area is reduced by variations in process size and/or misalignment, similar to the first embodiment of the present invention. However, in the case where the memory cell layer is formed by being separated a plurality of times, all the diameters of the upper part of the holes in which the channel of the lower selection gate layer is formed and all the diameters of the upper part of the holes in which the channel of each memory layer is formed are enlarged. That is, the diameters of the upper part of the channel of the first pillar shaped semiconductor and a plurality of the second pillar shaped semiconductors are enlarged.

On the other hand, the diameter of the transistor plug hole in which a channel of the upper selection gate (SGD) layer is formed is formed almost the same. Therefore, the entire diameter or the third pillar shaped semiconductor which is formed in the hole of the upper selection gate (SGD) layer is also formed the same. As stated above, the resistance between the metal and silicon is small. As a result, even if the contact area between the metal and silicon is reduced, there is no damage to the reliability of the device.

The transistor plug hole has silicon nitride spacers 197 on the nitride oxide film 185 which is formed at the top of the upper selection gate (SGD) layer. As a result, the diameter of the upper part of the hole is narrowly formed. Therefore, because the diameter of the tungsten plug 188c, which connects the bit line BL8 of the metal wiring layer and the third pillar shaped semiconductor which is the channel of the upper selection gate (SGD) layer, at the hole part is narrowly formed, the contact area of the tungsten plug 188c and the third pillar shaped semiconductor 193 is reduced. However, because the resistance between the amorphous silicon layer which forms the channel of the upper selection gate and the metal is small at first, even if the contact area is reduced and resistance increases, there is no damage to the reliability of the device.

Because the silicon nitride spacers 197 is formed within the layer of the nitride oxide film 185 which is formed at the top of the upper selection gate (SGD) layer, the interval between an adjacent hole becomes wider than the interval between holes which is set at the time of design (in the drawing, the interval of an adjacent hole in the layer of the amorphous silicon film 184 of the upper selection gate layer). Specifically, an interval to which the thickness P of the silicon nitride spacer 197 in the hole interval α is added is secured between the pillar shaped amorphous silicon layer 193a (third pillar shaped semiconductor) of the upper selection gate layer which is connected to the bit line BL1 (8a) in FIG. 25 and the tungsten plug hole 188c which is connected to the bit line BL2 (8b) which adjoins the bit line BL1 (8a).

FIG. 26 shows the state where misalignment of the metal wiring layer occurs in the nonvolatile semiconductor memory device according to the second embodiment of the present invention which has silicon nitride spacers 197 of a thickness b stated above. In FIG. 26, the metal wiring layer is misaligned by the distance part γ facing the right side of the drawing. Therefore, the bit line BL2 (8b) (specifically, the tungsten plug 188c which is connected to the bit line BL2 (8b)) and the pillar shaped amorphous silicon layer 193a (third pillar shaped semiconductor) of the upper selection gate layer which is connected to the bit line BL1 (8a) come close together by the distance γ. However, because of the intervening silicon nitride spacer 197 which has a thickness β, for example, the distance A1 from the bit line BL2 (8b) up to the pillar shaped amorphous silicon layer 193a (third pillar shaped semiconductor) becomes longer by the thickness β of the silicon nitride spacer 197. As a result, it is possible to adjust the misalignment γ by the thickness β of the silicon nitride spacer 197 and reduce a drop in a short margin.

The manufacturing method of the nonvolatile semiconductor memory device according to the second embodiment of the present invention will be explained with reference to FIG. 27 to FIG. 32. In FIG. 27 to FIG. 32, the peripheral circuit area is shown on the left side, and the memory transistor area is shown on the right side. Also, in the memory transistor area, parts corresponding to an area A part, an area B part and a cross section Y-Y' of the nonvolatile semiconductor memory device 1 according to first embodiment of the present invention shown in FIG. 1 are shown.

In the manufacturing method of the nonvolatile semiconductor memory device according to the second embodiment of the present invention, the process up to the formation of the pillar shaped amorphous silicon layer which become the channel part of the upper selection gate layer, is the same as that in the first embodiment of the present invention and thus its explanation is omitted here.

Figure 27:
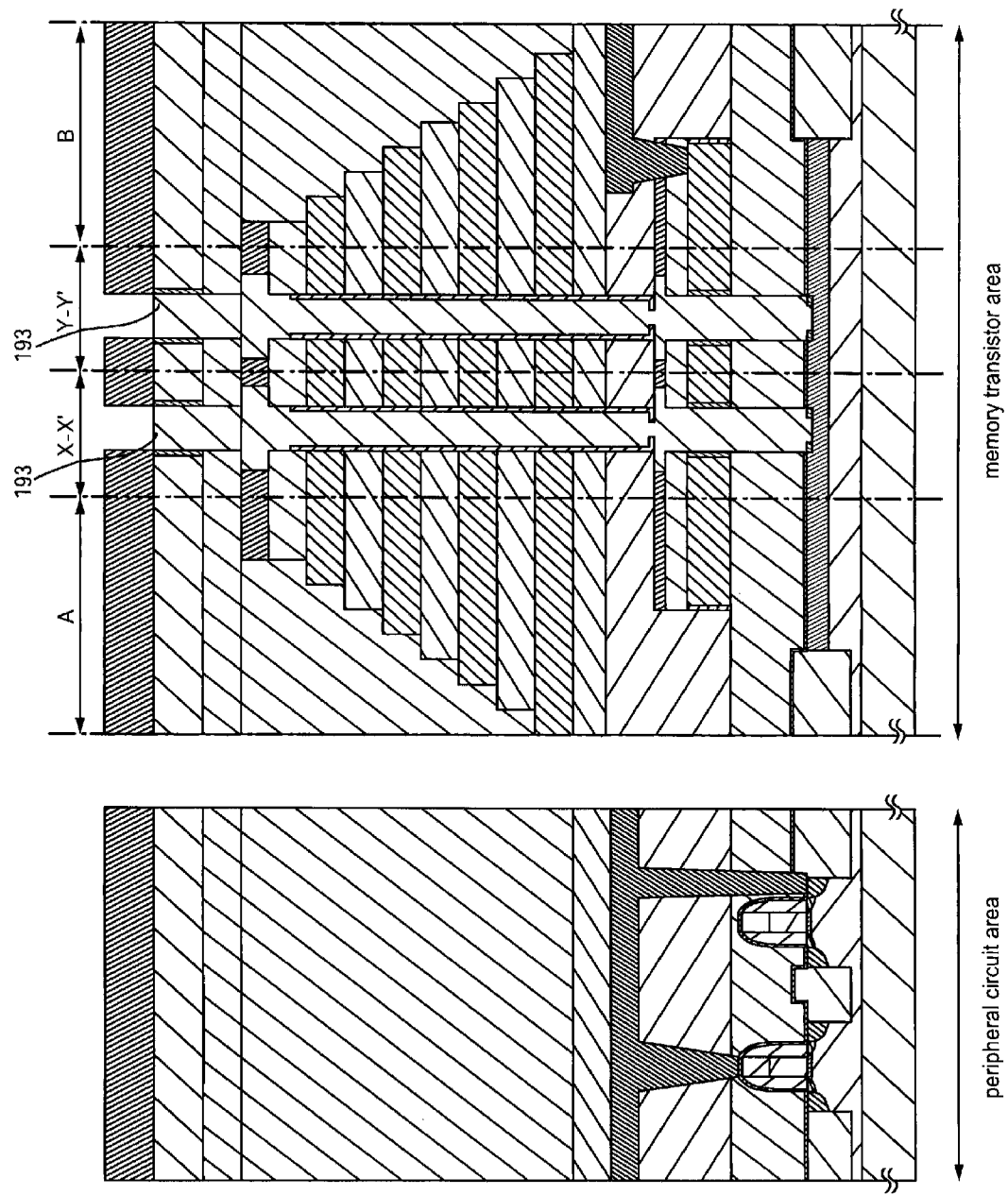
FIG. 27 is a diagram that shows a manufacturing process of the nonvolatile semiconductor memory device 1 according to another embodiment of the present invention.

In the manufacturing method of the nonvolatile semiconductor memory device according to the second embodiment of the present invention, the pillar shaped amorphous silicon layer (the third pillar shaped semiconductor) 193 is formed (FIG. 16). The pillar shaped amorphous silicon layer 193 becomes the channel of the upper selection gate layer. Next, a part of the amorphous silicon layer (the third pillar shaped semiconductor) 193 is recessed by dry etching etc. (FIG. 27). Thereby, a part of the transistor plug hole 186, particularly, the portion of the silicon nitride 185 which is positioned at the top of the upper selection gate layer is exposed.

Figure 29:
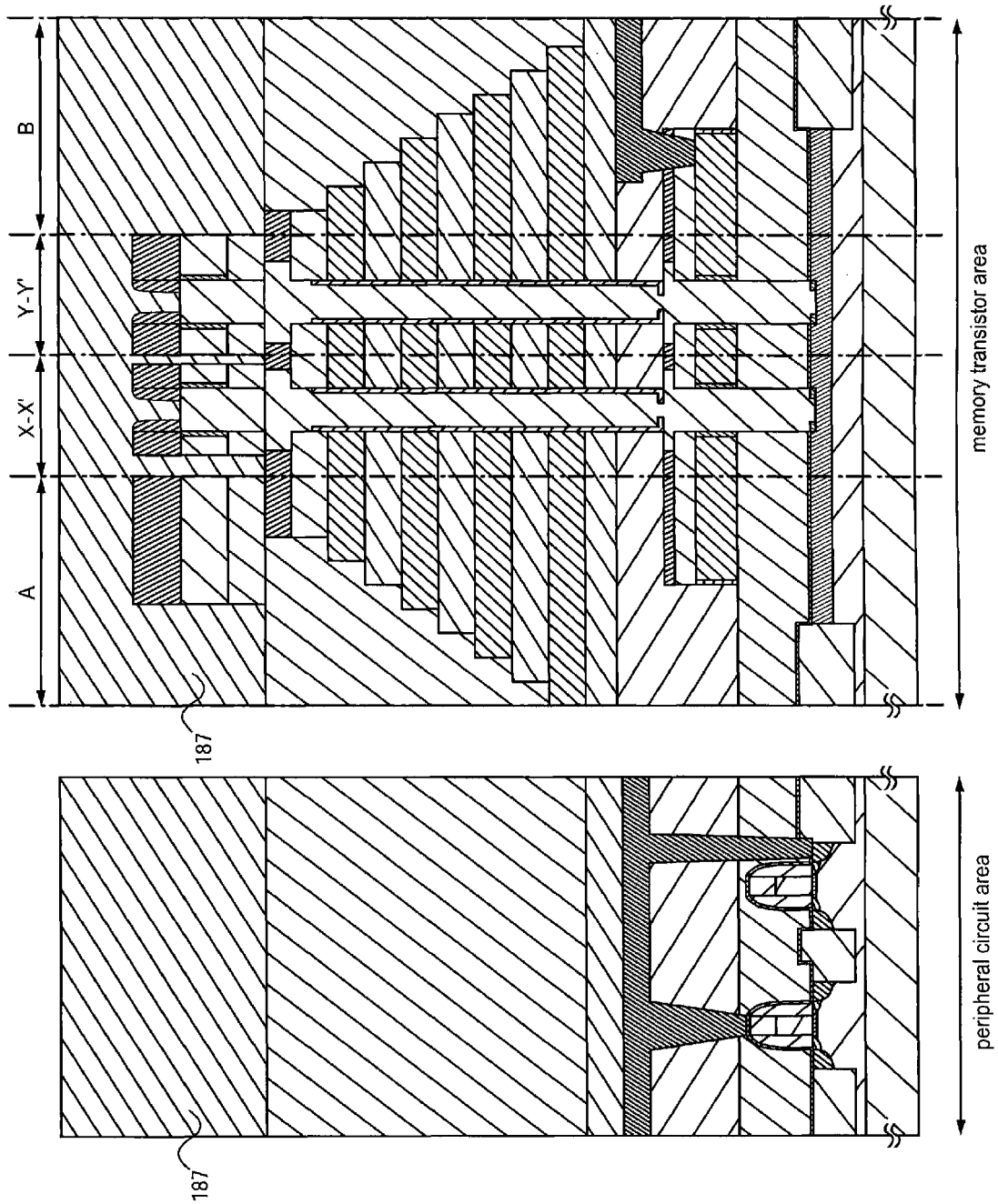
FIG. 29 is a diagram that shows a manufacturing process of the nonvolatile semiconductor memory device 1 according to another embodiment of the present invention.
Figure 30:
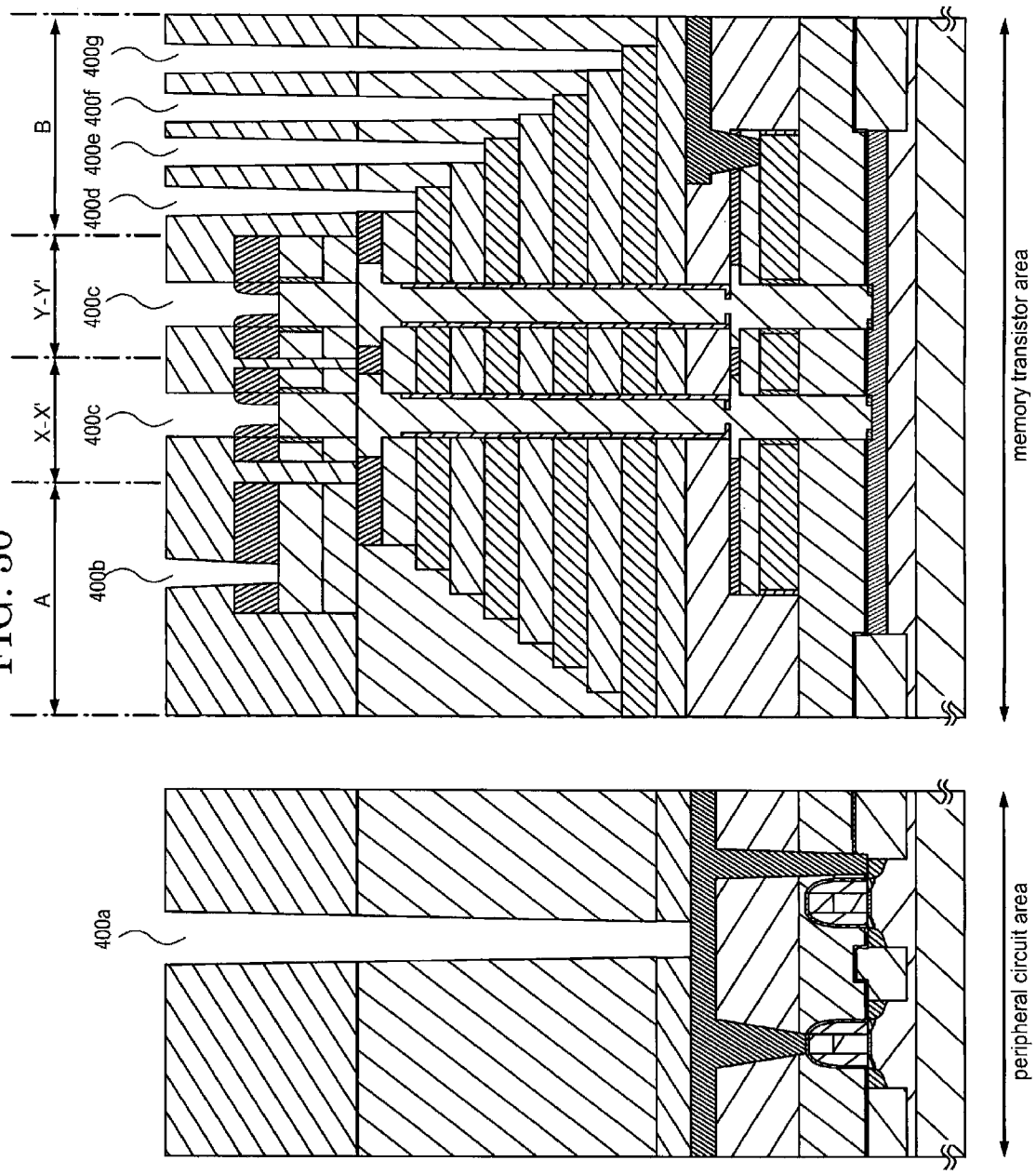
FIG. 30 is a diagram that shows a manufacturing process of the nonvolatile semiconductor memory device 1 according to another embodiment of the present invention.
Figure 31:
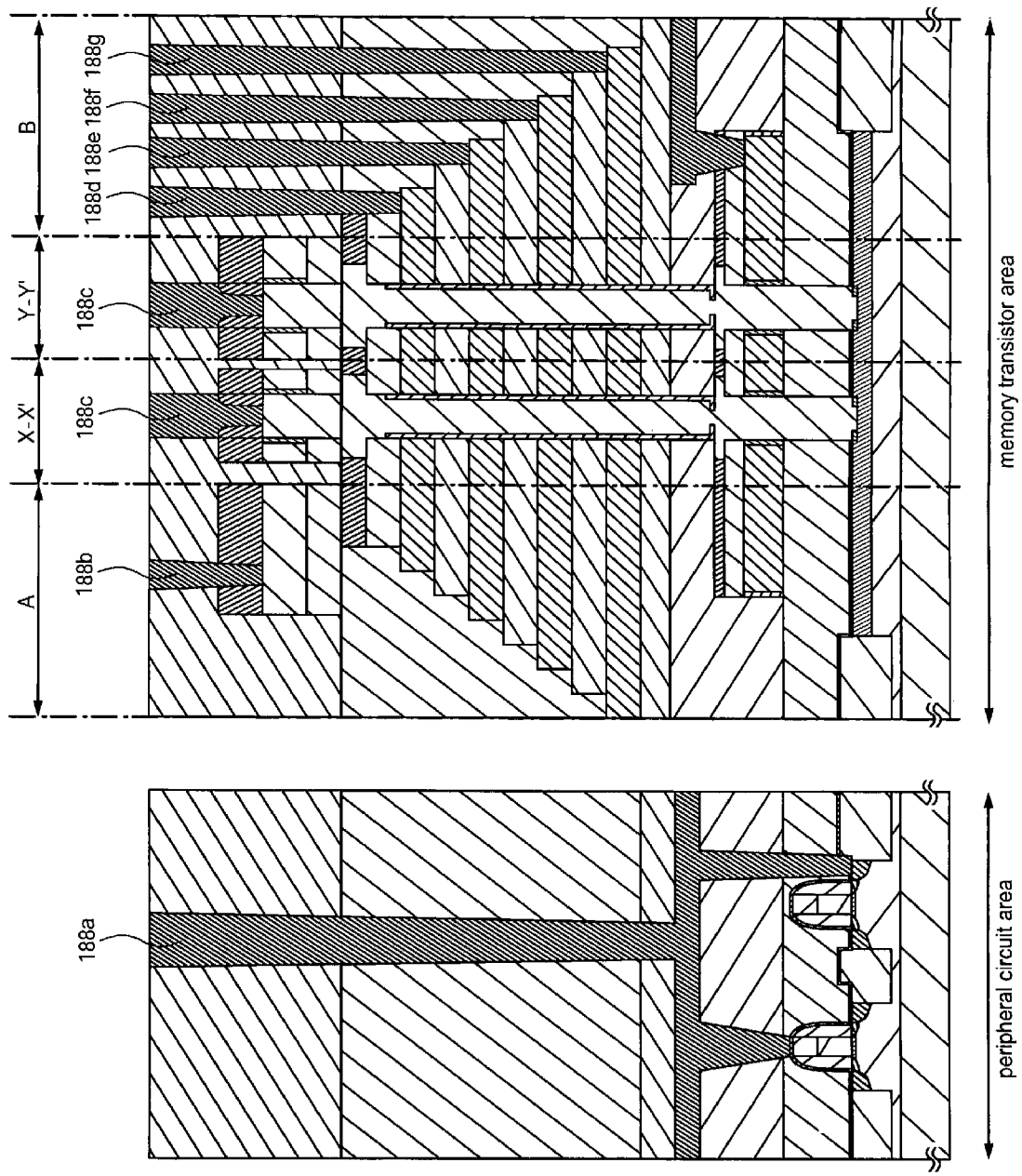
FIG. 31 is a diagram that shows a manufacturing process of the nonvolatile semiconductor memory device 1 according to another embodiment of the present invention.
Figure 32:
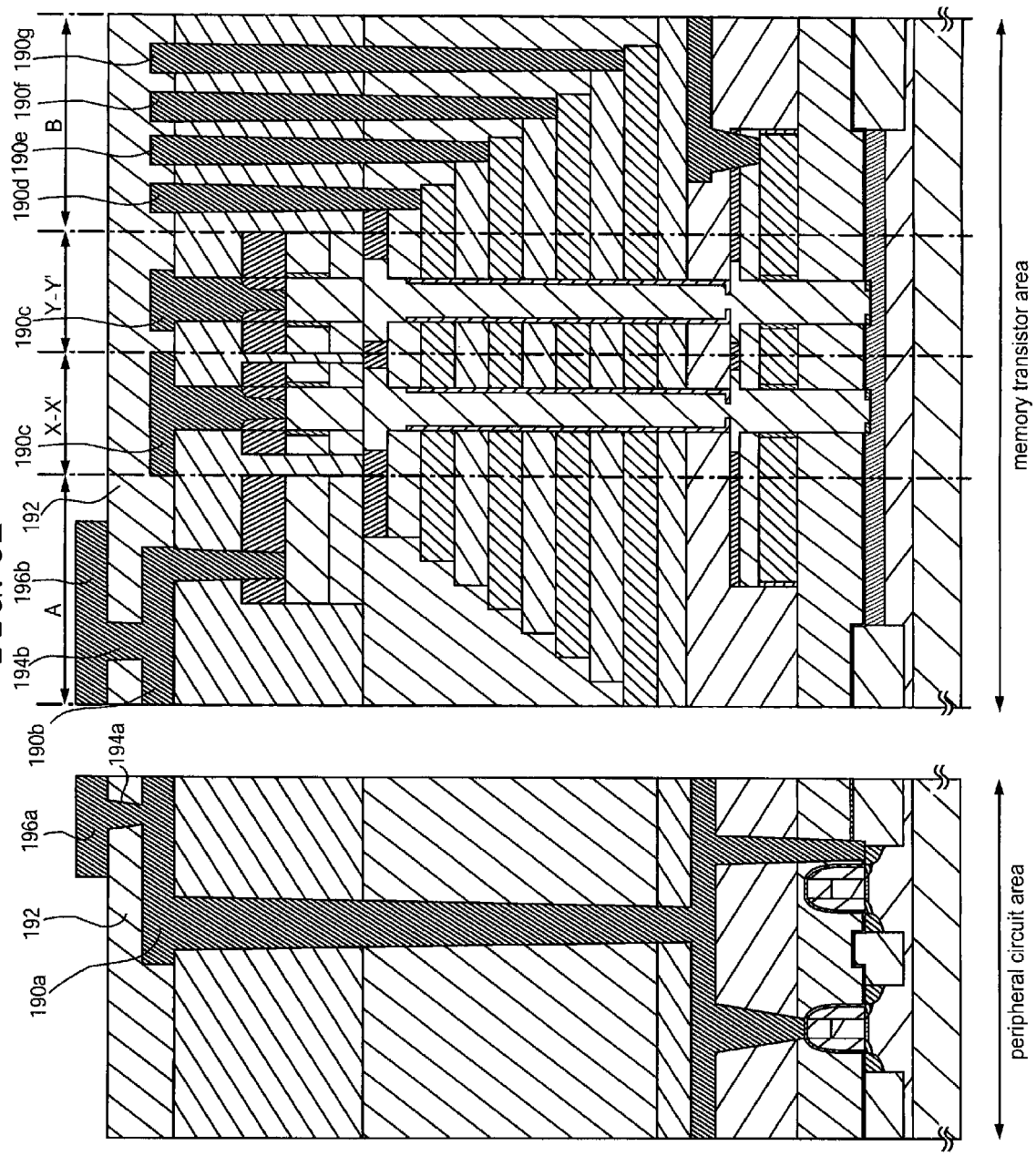
FIG. 32 is a diagram that shows a manufacturing process of the nonvolatile semiconductor memory device 1 according to another embodiment of the present invention.

Next, the silicon nitride film is formed on the whole surface of the substrate. This silicon nitride film is etched back by dry etching such as RIE (RIE: reactive ion etching). Thereby, the silicon nitride spacers 197, in which the silicon nitride spacer has a thickness β, are formed on the side walls of the transistor plug holes 186 (FIG. 28). Next, the selection gate transistor SDTr layer is separated by photo etching process. And then, the silicon oxide film 187 is formed as the premetal dielectric film (PMD). The silicon oxide film 187 is planarized by CMP (FIG. 29). Next, contact holes 400a, 400b, 400c, 400d, 400e, 400f and 400g are formed by photo etching process (FIG. 30). The tungsten film is embedded in these contact holes, and then, CMP processing is performed on the tungsten film. Thereby, the tungsten plugs 188a, 188b, 188c, 188d, 188e, 188f and 188g are formed (FIG. 31).

As described above, the silicon nitride spacers 197, in which the silicon nitride spacer has a thickness A, are formed on the side walls of the transistor plug holes 186. Therefore, the diameter of the tungsten plug 188c which is connected to the pillar shaped amorphous silicon layer (the third pillar shaped semiconductor) which is the channel of the upper selection gate layer, is narrowly formed in the part where the silicon nitride spacer is formed. Accordingly, the contact area of the tungsten plug 188c and the pillar shaped amorphous silicon layer (the third pillar shaped semiconductor) 193 decreases, and the reliability of the device is not affected as described above.

From the process which forms the aluminum electrodes (190a to 190g) to the process which forms the tungsten plug 194a, 194b, the aluminum electrodes 196a and 196b is the same as that in the first embodiment of the present invention.

By the above described processes, the nonvolatile semiconductor memory device according to the second embodiment of the present invention may be manufactured.

By the process described above, the nonvolatile semiconductor memory device according to the second embodiment of the present invention has silicon nitride spacers 197 on the upper part of the transistor plug holes 186 in which the channel of the upper selection gate layer is formed. Therefore, the diameter of the upper part of the hole and of the hole part of the tungsten plug 188c which is formed in the silicon oxide layer 187 which is the premetal insulating film of are narrowly formed. As a result, even if a variation in process size and/or misalignment occurs with the metal wiring layer, it is possible to reduce a drop in the short margin between the pillar shaped amorphous silicon layer 193 (third pillar shaped semiconductor) which is connected to one bit line BL8, and the adjacent bit line BL8 (more specifically, the metal plug 188c which is connected to the bit line BL8).

Furthermore, in the second embodiment of the present invention, the order in which the silicon oxide film and the silicon nitride film which are formed on the amorphous silicon layer (or polysilicon layer) in which the channel of the lower selection gate layer and memory cell layer is formed may be reversed.

We claim:

1. A nonvolatile semiconductor memory device comprising:
    a substrate; and
    a plurality of memory strings arranged in a matrix shape in a row direction and a column direction, each of said plurality of memory strings comprising:

a first selection transistor comprising:
  a first pillar shaped semiconductor formed perpendicular to said substrate;
  a first gate insulating film formed around said first pillar shaped semiconductor; and
  a first gate electrode formed around said first gate insulating film; and
a plurality of memory cells comprising:
  a second pillar shaped semiconductor formed on said first pillar shaped semiconductor, the diameter of said first pillar shaped semiconductor being larger than the diameter of said second pillar shaped semiconductor at the part where said second pillar shaped semiconductor is connected to said first pillar shaped semiconductor;
  a first insulating film formed around said second pillar shaped semiconductor;
  a charge storage layer formed around said first insulating film;
  a second insulating film formed around said charge storage layer;
  first to nth electrodes formed around said second insulating film (n is a natural number not less than 2), said first to nth electrodes being plate shaped; and
  a plurality of third insulating films being plate shaped; and,
a second selection transistor comprising:
  a third pillar shaped semiconductor formed on said second pillar shaped semiconductor;
  a second gate insulating film formed around said third pillar shaped semiconductor; and
  a second gate electrode formed around said second gate insulating film,
wherein said first to nth electrodes of a first memory string which is one of said plurality of memory strings are shared as first to nth conductor layers spread in two dimensions between each of a second memory string adjacent to said first memory string in said column direction and a third memory string adjacent to said first memory string in said row direction;
each of said first to nth electrodes and each of said plurality of third insulating films are vertically alternately stacked;
edges of said first to nth electrodes and edges of said plurality of third insulating films are formed in a stepwise shape; and
said plurality of memory cells are arranged in said first to nth electrodes and in said plurality of third insulating films with an array shape.

2. The nonvolatile semiconductor memory device according to claim 1, wherein said plurality of memory cells are connected in series in said each of the plurality of memory strings.

3. The nonvolatile semiconductor memory device according to claim 1 wherein:
the first insulating film is a silicon oxide film;
the charge storage layer is a silicon nitride film, and
the second insulating film is a silicon oxide film.

4. The nonvolatile semiconductor memory device according to claim 1, wherein the diameter of said second pillar shaped semiconductor is larger than the diameter of said third pillar shaped semiconductor at the part where said second pillar shaped semiconductor is connected to said third pillar shaped semiconductor.

5. The nonvolatile semiconductor memory device according to claim 1 wherein:
said memory string includes a metal wiring layer formed on said second selection transistor, said metal wiring layer including a bit line and a metal plug which connects said bit line and said third pillar shaped semiconductor; and
a diameter of said metal plug is smaller than the diameter of said third pillar shaped semiconductor at the part where said metal plug is connected to said third pillar shaped semiconductor.

6. The nonvolatile semiconductor memory device according to claim 5, wherein a film is formed at said part where said metal plug is connected to said third pillar shaped semiconductor.

7. A nonvolatile semiconductor memory device comprising:
a substrate; and
a plurality of memory strings arranged in a matrix shape in a row direction and a column direction, each of said plurality of memory strings comprising:
  a first selection transistor comprising:
    a first pillar shaped semiconductor formed perpendicular to said substrate;
    a first gate insulating film formed around said first pillar shaped semiconductor; and
    a first gate electrode formed around said first gate insulating film; and
  a plurality of memory cells comprising:
    a second pillar shaped semiconductor formed on said first pillar shaped semiconductor;
    a first insulating film formed around said second pillar shaped semiconductor;
    a charge storage layer formed around said first insulating film;
    a second insulating film formed around said charge storage layer;
    first to nth electrodes formed around said second insulating film (n is a natural number not less than 2), said first to nth electrodes being plate shaped; and
    a plurality of third insulating films being plate shaped; and,
  a second selection transistor comprising:
    a third pillar shaped semiconductor formed on said second pillar shaped semiconductor, the diameter of said second pillar shaped semiconductor being larger than the diameter of said third pillar shaped semiconductor at the part where said third pillar shaped semiconductor is connected to said second pillar shaped semiconductor;
    a second gate insulating film formed around said third pillar shaped semiconductor; and
    a second gate electrode formed around said second gate insulating film,
wherein said first to nth electrodes of a first memory string which is one of said plurality of memory strings are shared as first to nth conductor layers spread in two dimensions between each of a second memory string adjacent to said first memory string in said column direction and a third memory string adjacent to said first memory string in said row direction;
each of said first to nth electrodes and each of said plurality of third insulating films are vertically alternately stacked;
edges of the first to nth electrodes and edges of said plurality of third insulating films are formed in a stepwise shape; and said plurality of memory cells are arranged in said first to nth electrodes and in said plurality of third insulating films with an array shape.

8. The nonvolatile semiconductor memory device according to claim 7, wherein said plurality of memory calls are connected in series in said each of the plurality of memory strings.

9. The nonvolatile semiconductor memory device according to claim 7 wherein:
the first insulating film is a silicon oxide film;
the charge storage layer is a silicon nitride film, and
the second insulating film is a silicon oxide film.

10. The nonvolatile semiconductor memory device according to claim 7, wherein the diameter of the said first pillar shaped semiconductor is larger than the diameter of said second pillar shaped semiconductor at the part where said first pillar shaped semiconductor is connected to said second pillar shaped semiconductor.

11. The nonvolatile semiconductor memory device according to claim 7 wherein:
said memory string includes a metal wiring layer formed on said second selection transistor, said metal wiring layer including a bit line and a metal plug which connects said bit line and said third pillar shaped semiconductor; and
a diameter of said metal plug is smaller than the diameter of said third pillar shaped semiconductor at the part where said metal plug is connected to said third pillar shaped semiconductor.

12. The nonvolatile semiconductor memory device according to claim 11, wherein a film is formed at said part where said metal plug is connected to said third pillar shaped semiconductor.

* * * * *